(12) United States Patent
Banba et al.

(10) Patent No.: US 6,226,224 B1
(45) Date of Patent: *May 1, 2001

(54) SEMICONDUCTOR INTEGRATED CIRCUIT DEVICE AND STORAGE DEVICE

(75) Inventors: Hironori Banba, Kamakura; Hitoshi Shiga, Yokohama; Shigeru Atsumi, Yokohama; Akira Umezawa, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/502,016

(22) Filed: Feb. 11, 2000

Related U.S. Application Data

(63) Continuation of application No. 09/031,686, filed on Feb. 27, 1998, now Pat. No. 6,041,012.

(30) Foreign Application Priority Data

Feb. 27, 1997 (JP) .................................................. 9-44344

(51) Int. Cl.⁷ ...................................................... G11C 7/00
(52) U.S. Cl. .......................... 365/276; 365/227; 365/229; 365/185.18; 365/189.07
(58) Field of Search ..................................... 365/226, 227, 365/229, 185.18, 189.07

(56) References Cited

U.S. PATENT DOCUMENTS

| | | |
|---|---|---|
| 5,414,669 | 5/1995 | Tedrow et al. ........................ 365/226 |
| 5,594,360 | 1/1997 | Wojciechowski ..................... 365/226 |
| 5,646,898 | 7/1997 | Manning ............................... 365/226 |
| 5,663,926 | 9/1997 | Haseo .................................... 365/226 |
| 5,781,473 | 7/1998 | Javanifard et al. ................... 365/226 |
| 5,812,017 | 9/1998 | Golla et al. ........................... 365/226 |
| 5,828,596 | 10/1998 | Takata et al. ......................... 365/226 |
| 5,881,012 | 3/1999 | Kawasaki et al. .................... 365/226 |
| 6,041,012 | * 3/2000 | Banba et al. .......................... 365/226 |

FOREIGN PATENT DOCUMENTS 8-287677    4/1996    (JP) .

* cited by examiner

Primary Examiner—Richard Elms
Assistant Examiner—Vanthu Nguyen
(74) Attorney, Agent, or Firm—Banner & Witcoff, Ltd.

(57) ABSTRACT

A semiconductor integrated circuit device according to the present invention includes a booster circuit 1 for raising an external power supply voltage Vccext, a level detecting circuit 2 for detecting fluctuation in a stepped-up voltage Vccint2, an internal voltage generating circuit 3 for generating an internal voltage Vccint on the basis of the stepped-up voltage Vccint2, an address buffer 4, an address decoder 5, and a memory cell array 6 of an EEPROM structure. The level detecting circuit 2 includes a first level detecting part for performing level detection during a memory access state, and a second level detecting part for performing level detection during a stand-by state. During the stand-by state, the internal voltage generating circuit 3 short-circuits the stepped-up voltage Vccint2 and the internal voltage Vccint. The second level detecting part has lower power consumption than that of the first level detecting part, so that it is possible to reducing the power consumption during the stand-by state without lowering the driving voltage.

19 Claims, 20 Drawing Sheets

CHARGING PUMP

OSCILLATOR

DIFFERENTIAL AMPLIFIER

LEVEL SHIFTER

SEMICONDUCTOR INTEGRATED CIRCUIT DEVICE AND STORAGE DEVICE

This application is a continuation of prior application Ser. No. 09/031,686, filed Feb. 27, 1998, now U.S. Pat. No. 6,041,012.

BACKGROUND OF THE INVENTION

1. Field of the Invention

The present invention relates generally to a semiconductor integrated circuit device and a storage device. More specifically, the invention relates to the semiconductor integrated circuit device and the storage device for raising a power supply voltage supplied from the outside to drive a semiconductor circuit, such as a flash memory, which is capable of batch erasing stored data.

2. Description of the Background Art

A flash memory, which is a kind of a non-volatile semiconductor memory, comprises a matrix arrangement of electrically erasable programmable read-only memory (EEPROM) cells, which are capable of electrically writing and erasing data.

FIG. 25 is a diagram illustrating the structure of a non-volatile semiconductor memory of this type. Each of memory cells in a semiconductor chip comprises a stack gate type transistor having a floating gate FG and a control gate CG. When electrons are injected into the floating gate FG or when electrons are emitted from the floating gate FG, a threshold voltage varies. By utilizing this variation in threshold voltage, data are written in and read out of the respective memory cells.

Specifically, logic "1" or "0" is determined by whether or not the current flows when the power supply voltage is applied to the control gate CG of a memory cell to be read out. The threshold voltage of a memory cell is about 2 V when the memory cell has logic "1" and higher than or equal to 5 V when it has logic "0".

In a conventional flash memory, since both of a power supply voltage supplied from the outside and a control gate voltage during readout are set to 5 V, there is particularly no problem even if the power supply voltage is applied directly to a control gate CG during readout.

In recent years, with the miniaturization of memory cells and the increase of memory capacity, it is required to lower the power supply voltage supplied from the outside; therefore, the external power supply voltage has generally been set to 3 V.

When the power supply voltage is set to 5 V as the prior art, the difference between the voltage VG applied to the control gate CG during readout and the threshold voltage Vth when the memory cell has logic "1" is VG–Vth=5–2=3 V. On the other hand, when the power supply voltage is 3 V, VG–Vth=3–2=1 V, which is a third of that when the power supply voltage is 5 V, so that the current flowing through the memory cell (which will be hereinafter referred to as a "cell current") is decreased. The decrease of the cell current decreases the readout rate, and also decreases the margin of fluctuation in the power supply voltage.

Consequently, there is proposed a technique for raising the power supply voltage, which is supplied from the outside (which will be hereinafter referred to as an "external power supply voltage Vccext") in a semiconductor chip, to higher voltage than 3 V, to generate an internal voltage Vccint, and for applying the internal voltage Vccint to the control gate of the memory cell. This internal voltage Vccint must be set to 5 V even in a stand-by state, in which data are not written in and read out of the memory cell. Because if the internal voltage Vccint is set to be lower than 5 V during the stand-by state, the voltage level of the internal voltage Vccint must be started to rise immediately after the operation state is switched from the stand-by state to a memory access state. Therefore, it takes a lot of time until the internal voltage Vccint reaches 5 V, so that it is not possible to read data out of the memory cell during that period of time.

Accordingly, the voltage level of the internal voltage Vccint in the stand-by state must be set to the same as that in the memory access state. In addition, since a non-volatile memory, such as a flash memory, is often used for a portable apparatus driven by a electric battery, the power consumption during the stand-by state is preferably as low as possible.

SUMMARY OF THE INVENTION

Therefore, an object of the present invention is to eliminate the aforementioned problems and to provide a semiconductor integrated circuit device, which can supply a higher voltage than a voltage supplied from the outside to a semiconductor circuit and a storage device, such as a flash memory, with a low power consumption and which can prevent the voltage supplied to the semiconductor circuit and the storage device from fluctuating even if the operation state is switched.

To achieve the above-mentioned object, the present invention provides a semiconductor integrated circuit device comprising:

a booster circuit for raising a voltage supplied from an outside;

a semiconductor circuit driven by a voltage depending on a stepped-up voltage raised by said booster circuit;

a first level detecting circuit for detecting fluctuation in said stepped-up voltage during a first operation state of said semiconductor circuit; and a second level detecting circuit for detecting fluctuation in said stepped-up voltage during a second operation state of said semiconductor circuit, said second level detecting circuit being formed by a circuit having a lower power consumption than that of said first level detecting circuit.

The present invention provides a semiconductor integrated circuit device comprising:

a booster circuit for raising a voltage supplied from an outside;

a semiconductor circuit driven by a voltage depending on a stepped-up voltage raised by said booster circuit; and an internal voltage generating circuit for generating an internal voltage on the basis of said stepped-up voltage, said internal voltage generating circuit setting said internal voltage to a lower voltage level than said stepped-up voltage during a first operation state of said semiconductor circuit, and setting said internal voltage to a voltage level substantially equal to said stepped-up voltage during a second operation state of said semiconductor circuit.

The present invention provides a semiconductor integrated circuit device comprising:

a booster circuit for raising a voltage supplied from an outside;

a semiconductor circuit driven by a voltage depending on a stepped-up voltage raised by said booster circuit; and a level detecting circuit for detecting fluctuation in said stepped-up voltage, wherein said booster circuit comprises a pulse generator for generating a pulse signal, and a charging pump for raising said voltage in accordance with said pulse signal, a level detecting operation of said level detecting circuit being controlled by said pulse signal.

The present invention provides a semiconductor integrated circuit device comprising:

a booster circuit for raising a voltage supplied from an outside;

a semiconductor circuit driven by a voltage depending on a stepped-up voltage raised by said booster circuit, a level detecting circuit for detecting fluctuation in said stepped-up voltage;

a reference voltage generating circuit for generating a reference voltage of a predetermined voltage level on the basis of said voltage supplied from the outside; and wherein a current consumption of said level detecting circuit and said reference voltage generating circuit are controlled by a common constant current source.

The present invention provides a semiconductor integrated circuit device comprising:

a booster circuit for raising a voltage supplied from an outside;

a semiconductor circuit driven by a voltage depending on a stepped-up voltage raised by said booster circuit; and an internal voltage generating circuit for generating an internal voltage on the basis of said stepped-up voltage, said internal voltage generating circuit comprising:

a switching circuit for switching whether output terminals of said booster circuit and said internal voltage generating circuit are short-circuited or not; and a switch control circuit for controlling said switching circuit so that said internal voltage becomes substantially equal to said stepped-up voltage, when said internal voltage becomes lower than or equal to a predetermined voltage after an operation state of said semiconductor circuit is changed from a first operation state to a second operation state.

The present invention provides a semiconductor integrated circuit device comprising:

a booster circuit for raising a voltage supplied from an outside, a semiconductor circuit driven by a voltage depending on a stepped-up voltage raised by said booster circuit, and an internal voltage generating circuit for generating an internal voltage on the basis of said stepped-up voltage, said internal voltage generating circuit comprising: a first internal voltage detecting circuit for detecting fluctuation in said internal voltage during a first operation state of said semiconductor circuit; and a second internal voltage detecting circuit for detecting fluctuation in said internal voltage during a second operation state of said semiconductor circuit, said second internal voltage detecting circuit being formed by a circuit having a lower power consumption than that of said first internal voltage detecting circuit.

The present invention provides a semiconductor integrated circuit device comprising:

a booster circuit for raising a voltage supplied from an outside; and a semiconductor circuit driven by a voltage depending on a stepped-up voltage raised by said booster circuit, wherein said booster circuit includes a first charging pump and a second charging pump having a lower driving force than that of said first charging pump, said first charging pump operating so that said stepped-up voltage becomes to a first voltage during a first operation state of said semiconductor circuit, and said second charging pump operating so that said stepped-up voltage becomes to a second voltage different from said first voltage during a second operation state of said semiconductor circuit.

BRIEF DESCRIPTION OF THE DRAWINGS

The present invention will be understood more fully from the detailed description given herebelow and the accompanying drawings. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a semiconductor integrated circuit device and a storage device according to the present invention will be described in detail below.

A semiconductor integrated circuit device and a storage device, which will be described below, are designed to reduce the power consumption in a stand-by state for waiting data to be written in and read out of a memory cell array 6, and can reduce the power consumption without lowering so much the level of a power supply voltage for driving the memory cell array 6.

First Preferred Embodiment

Figure 1:
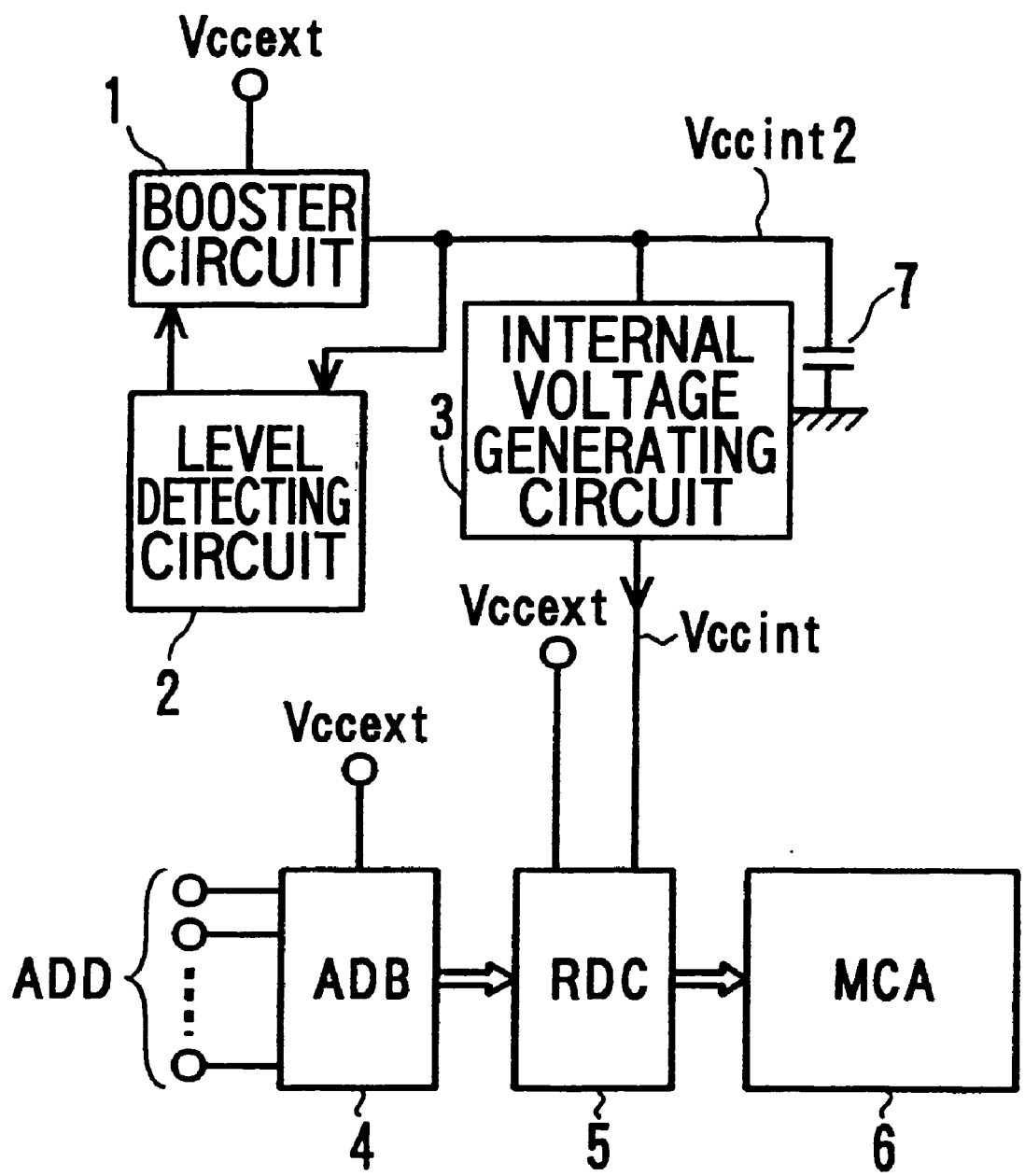
FIG. 1 is a schematic block diagram of the first preferred embodiment of a semiconductor integrated circuit device according to the present invention.

FIG. 1 is a schematic block diagram of the first preferred embodiment of a semiconductor integrated circuit device according to the present invention. This semiconductor integrated circuit device comprises a memory cell array 6 having an EEPROM structure (which will be hereinafter referred to as a "memory cell array 6"). FIG. 1 shows the construction that a word line of the memory cell array 6 is selected after address signals is inputted.

In this preferred embodiment, the semiconductor integrated circuit device comprises a booster circuit (or a step-up control circuit) 1, a level detecting circuit 2, an internal voltage generating circuit 3, an address buffer (ADB) 4, an address decoder (RDC) 5, and a memory cell array (MCA) 6.

The booster circuit 1 raises an external power supply voltage Vccext supplied from the outside, to generate a stepped-up voltage Vccint2. The voltage value of the stepped-up voltage Vccint2 during a memory access state, in which data are be written in and read out of the memory cell array 6, is different from that during a stand-by state, in which data are not written in and read out. For example, the voltage value of the stepped-up voltage Vccint2 is set to 6.5 V during the memory access state and to 5 V during the stand-by state.

The level detecting circuit 2 detects fluctuation in voltage level of the stepped-up voltage Vccint2 and inputs the detected results to the booster circuit 1. The internal voltage generating circuit 3 generates a voltage (which will be hereinafter referred to as an "internal voltage") Vccint, which is obtained by lowering the stepped-up voltage Vccint2.

The detailed constructions of the booster circuit 1, the level detecting circuit 2 and the internal voltage generating circuit 3 will be described later.

Address signals ADD inputted from the outside of a semiconductor chip is inputted to the address decoder 5 via the address buffer 4 to be decoded. The external power supply voltage Vccext and the internal voltage Vccint lowered by means of the internal voltage generating circuit 3 are supplied to the address decoder 5. The address decoder 5 converts a voltage level in addition to the decoding. Thus, the address decoder 5 outputs a decode signal on the basis of the internal voltage Vccint.

The output of the address decoder 5 is supplied to a word line (not shown) of the memory cell array 6. The address decoder 5 shown in FIG. 1 decodes a row address of the memory cell array 6, and an address decoder for decoding a column address is omitted from FIG. 1.

A stabilizing capacitor 7 of hundreds of PF is connected between the stepped-up voltage Vccint2 raised by means of the booster circuit 1 and an earth terminal. The address decoder 5 has a parasitic capacity of hundreds to tens of nF.

Before describing the detailed constructions of the respective elements shown in FIG. 1, the schematic operation of the whole semiconductor integrated circuit device will be described. In the memory access state, in which data are written in and read out of the memory cell array 6, the booster circuit 1 outputs a stepped-up voltage Vccint2 of, e.g., 6.5 V, and the internal voltage generating circuit 3 generates an internal voltage Vccint of, e.g., 5 V, on the basis of the stepped-up voltage Vccint2. The internal voltage Vccint is used as a power supply voltage for driving the address decoder 5 and so forth. The level detecting circuit 2 detects fluctuation in voltage level of the stepped-up voltage Vccint2, and the booster circuit 1 performs the feedback control on the basis of the detected results so that the stepped-up voltage Vccint 2 is constant.

The reason why the internal voltage Vccint is generated in addition to the stepped-up voltage Vccint2 is that if the stepped-up voltage Vccint2 is directly supplied to all the circuits of the semiconductor integrated circuit device, the stepped-up voltage Vccint2 is easy to fluctuate due to large load. If the internal voltage Vccint is supplied to the respective circuits, it is possible to decrease the load of the stepped-up voltage Vccint2, so that it is possible to reduce fluctuation in voltage value.

On the other hand, in the stand-by state for waiting data to be written in and read out of the memory cell array 6, the booster circuit 1 outputs a stepped-up voltage Vccint2 of, e.g., 5 V, and the internal voltage generating circuit 3 outputs an internal voltage Vccint of the same level (e.g., 5 V) as that of the stepped-up voltage Vccint2. Although the level detecting circuit 2 detects fluctuation in voltage level of the stepped-up voltage Vccint 2 similar to the memory access state, a low power consumption circuit works to decrease the power consumption during level detection unlike in the memory access state. The level detecting circuit 2 is intermittently operated so as to prevent the voltage level of the stepped-up voltage Vccint from becoming too high during the level detection.

The detailed construction of the booster circuit 1 of FIG. 1 will be described below.

Figure 2:
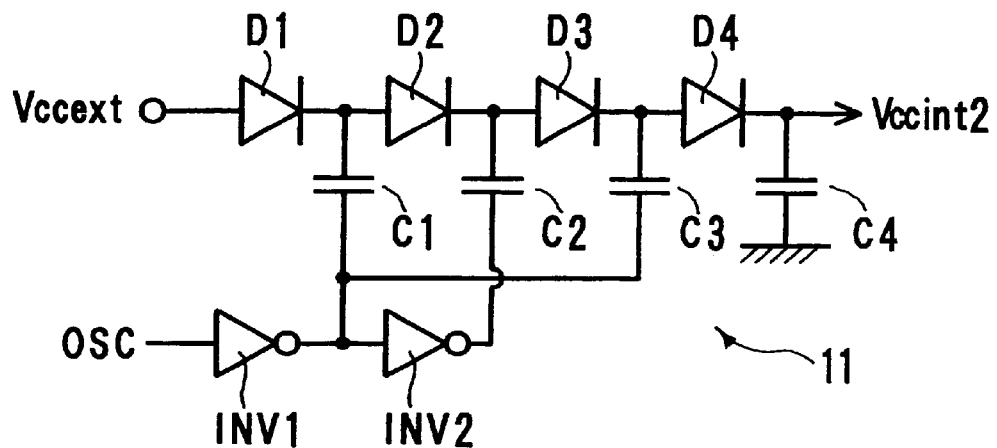
FIG. 2 is a circuit diagram illustrating the detailed construction of a charging pump.
Figure 3:
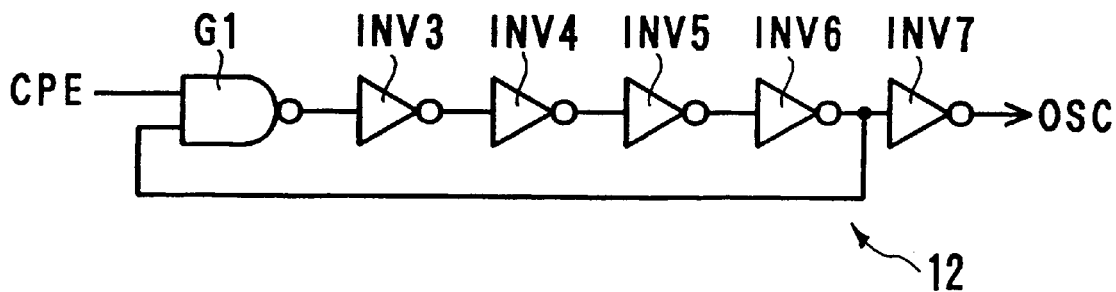
FIG. 3 is a circuit diagram illustrating the detailed construction of an oscillator.

The booster circuit 1 comprises a charging pump 11 shown by the circuit diagram of FIG. 2, and an oscillator 12 shown by the circuit diagram of FIG. 3.

As shown in FIG. 2, the charging pump 11 comprises diodes D1 through D4, capacitors C1 through C4, and inverters INV1 and INV2. The first stage diode D1 receives an external power supply voltage Vccext, and the first stage inverter INV1 receives an output OSC of the oscillator 12, which will be described later. The final stage diode D4 outputs a stepped-up voltage Vccint2.

The charging pump 11 sequentially transmits electric charge based on the output OSC of the oscillator 12 to the capacitors C1 through C4, and produce a higher voltage Vccint 2 than the external power supply voltage Vccext.

As shown in FIG. 3, the oscillator 12 comprises a plurality of inverters INV3 through INV7 connected in series, and a first stage NAND gate G1, to which the output of the inverter INV6 is fed back. When the level of a signal CPE inputted to the NAND gate G1 of FIG. 3 is a high level, oscillation occurs in the oscillator 12, and an oscillation signal is outputted from the output OSC. On the other hand, when the level of the signal CPE is a low level, the level of the output OSC is fixed to a low level. This signal CPE is outputted from the level detecting circuit 2, which will be described below.

As described above, during the memory access state, the stepped-up voltage Vccint2 of, e.g., 6.5 V, is outputted from the charging pump 11 shown in FIG. 2. In view of the current consumption due to dispersion in timing between address signals (address skew) and the voltage difference from the internal voltage Vccint (voltage margin), it is desired that the stepped-up voltage Vccint2 is as high as possible. However, in view of the current consumption, the transition time and the voltage proof of the semiconductor circuit when the operation state is changed from the stand-by state to the memory access state, the stepped-up voltage can not be set to so high. In fact, the voltage value of the stepped-up voltage Vccint2 is set in view of the above described various conditions.

The detailed construction of the level detecting circuit 2 shown in FIG. 1 will be described below.

Figure 4:
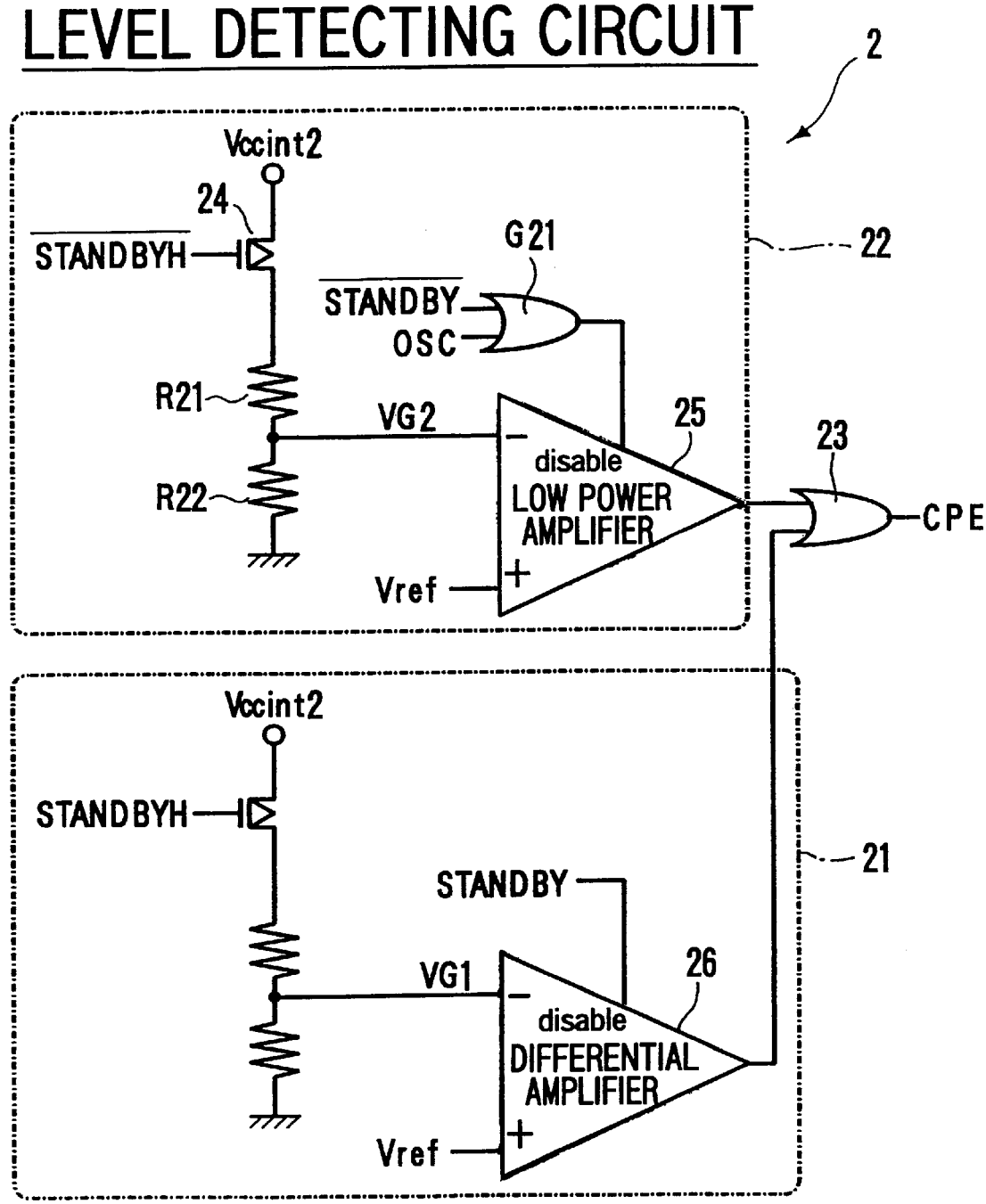
FIG. 4 is a circuit diagram illustrating the detailed construction of a level detecting circuit.

FIG. 4 is a circuit diagram illustrating the detailed construction of the level detecting circuit 2. The level detecting circuit 2 comprises a first level detecting part 21 for performing level detection in the memory access state, and a second level detecting part 22 for performing level detection in the stand-by state. The outputs of the respective level detecting parts 21, 22 are added by means of an OR gate 23 to be outputted. The output CPE of the OR gate 23 is inputted to the oscillator 12 shown in FIG. 3. That is, if the level of the output CPE of the level detecting circuit 2 is a high level, the oscillator 12 of FIG. 3 performs oscillating operation, so that the voltage level of the stepped-up voltage Vccint2 rises. On the other hand, if the level of the output CPE of the level detecting circuit 2 is a low level, the oscillator 12 stops performing oscillating operation, so that the voltage level of the stepped-up voltage Vccint2 drops. The power consumption of the second level detecting part 22 is less than or equal to half, e.g., less than or equal to a fourth of that of the first level detecting part 21.

The second level detecting part 22 shown in FIG. 4 comprises a PMOS transistor 24, resistors R21, R22, a low power consumption type differential amplifier (a low power amplifier) 25, and an OR gate G21. A reference voltage Vref is inputted to a (+)input terminal of the low power amplifier 25, and a voltage VG2 at the node of the resistors R21 and R22 is inputted to a (−) input terminal of the low power amplifier 25. The PMOS transistor 24 is turned on in the stand-by state. When the PMOS transistor 24 is turned on, the voltage VG2 obtained by dividing the stepped-up voltage Vccint2 by the resistors R21 and R22 is inputted to the (−) input terminal of the low power amplifier 25. When the voltage VG2 is lower than the reference voltage Vref, the output level of the lower power amplifier 25 is the high level, and the level of the output CPE of the level detecting circuit 2 is also the high level.

The OR gate G21 is connected to a disable terminal of the low power amplifier 25. When the operation state is the memory access state or when the level of the output OSC of the oscillator 12 shown in FIG. 3 is the high level, the operation state of the low power amplifier 25 is a disable state, so that the output level is fixed to the low level.

On the other hand, the first level detecting part 21 has the same construction as that of the second level detecting part 22, except that an ordinary differential amplifier 26 is substituted for the low power amplifier 25. The first level detecting part 21 performs level detection so that the divided voltage VG1 is coincident with the reference voltage Vref when the stepped-up voltage Vccint2 is 6.5 V.

Figure 5:
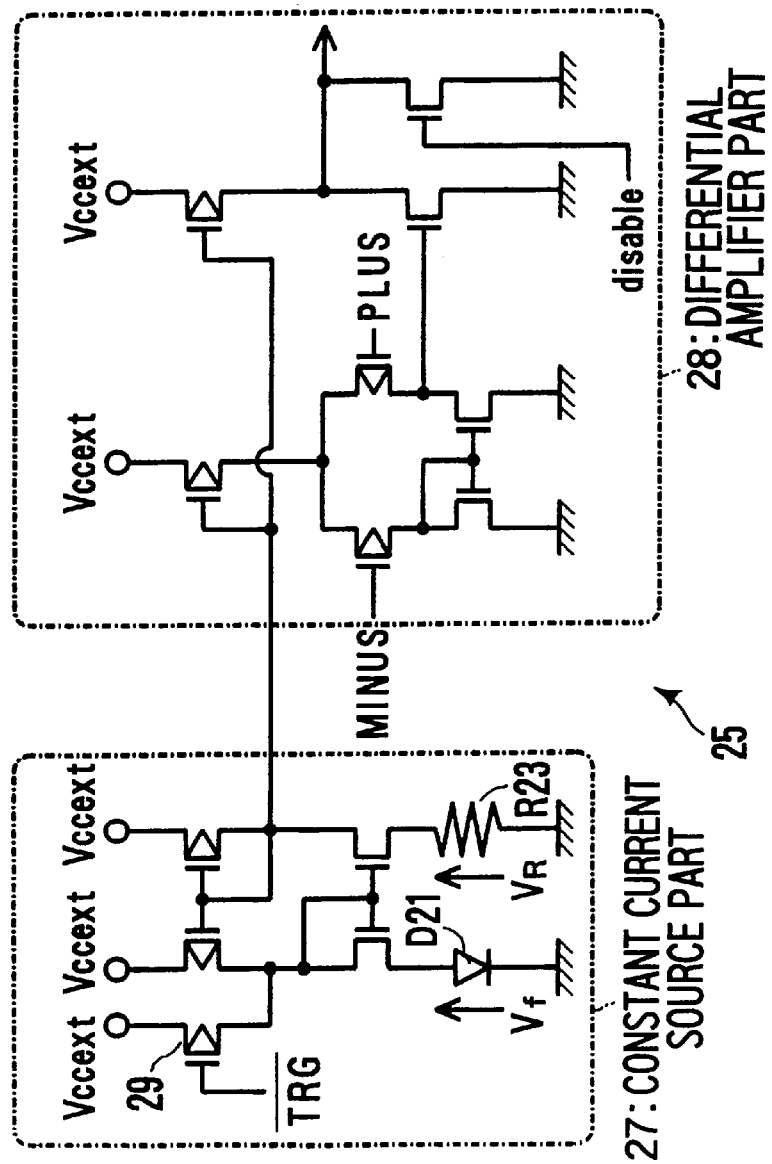
FIG. 5 is a circuit diagram illustrating the detailed construction of a low power amplifier in a second level detecting circuit.

FIG. 5 is a circuit diagram illustrating the detailed construction of the low power amplifier 25 in the second level detecting part 22. The low power amplifier 25 shown in FIG. 5 comprises a constant current source part 27 constructed by a Wilson's current mirror circuit, and a differential amplifier part 28. The constant current source part 27 has two stable points. When a power supply is turned on, the level of the gate terminal of the PMOS transistor 29 is temporarily set to a low level, and thereafter, set to be a high level. Therefore, the constant current source part 27 is stabilized when a voltage Vf applied between both ends of a diode D21 is coincident with a voltage VR applied between both ends of a resistor R23, and the quantity of current flowing through the diode D21 becomes equal to the quantity of current flowing through the resistor R23. The voltage Vf applied between both ends of the diode D21 is about 0.6 V, and the resistor R23 has a high resistance of, e.g., about 2400 kΩ. A current I flowing through the resistor R23 is expressed by I=Vf/R, where I=about 0.25 μA.

Thus, since little current flows through the resistor R23, the electric power consumed by the constant current source part 27 is decreased, so that the power consumption of the whole low power amplifier 25 is also reduced.

However, if the power consumption of the low power amplifier 25 is reduced, there is a problem in which it takes a lot of time for the level detection, and the stepped-up voltage Vccint2 may become higher than a predetermined voltage by a few voltages or higher by when the level detection is completed.

It will be discussed which of the going-up and going-down rates of the stepped-up voltage Vccint2 is greater when it takes a lot of time for the level detection. Although it can be considered that the factors going-down the stepped-up voltage Vccint2 include the currents flowing through the resistors R21, R22 shown in FIG. 4, the subthreshold currents and junction leak currents of the address decoder 5 and so forth to which the internal voltage Vccint is supplied, these currents are less than a few μA, which is sufficiently small. In addition, since the parasitic capacity of the internal voltage Vccint is hundreds pF to a few nF, it takes a time of a few μ seconds to hundreds μ seconds until the stepped-up voltage Vccint2 goes down by about 0.1V. On the other hand, when the level of the output CPE of the level detecting circuit 2 is a high level, the going-up degree of the stepped-up voltage Vccint2 is about 0.1 V per a cycle of the output OSC of the oscillator 12 shown in FIG. 3 although it depends upon the power supply voltage and the size of the charging pump 11. Furthermore, one cycle of the output OSC is tens nano seconds.

Thus, the stepped-up voltage Vccint2 rapidly goes up and slowly goes down. If it takes a lot of time for the level detection, the stepped-up voltage Vccint2 may become a considerably high voltage. Therefore, if the second level detecting part 22 shown in FIG. 4 detects the result in which the stepped-up voltage Vccint2 is lower than or equal to 5 V, the charging pump 11 in the booster circuit 1 is operated by one cycle, and then, the low power amplifier 25 is reset to stop the operation of the charging pump 11 when a pulse OSC is outputted from the oscillator 12 in the booster circuit 1.

As shown in FIG. 4, if the low power amplifier 25 is reset by the pulse OSC outputted from the oscillator 12 to force the level of the output CPE of the level detecting circuit 2 to a low level, it takes at least a few $\mu$ seconds until the level of the output CPE becomes to a high level next time. Consequently, the charging pump 11 operates every a few $\mu$ seconds to hundreds $\mu$ seconds in accordance with the going-down degree of the stepped-up voltage Vccint2, so that it is possible to prevent the stepped-up voltage Vccint2 from excessively going up.

Figure 6:
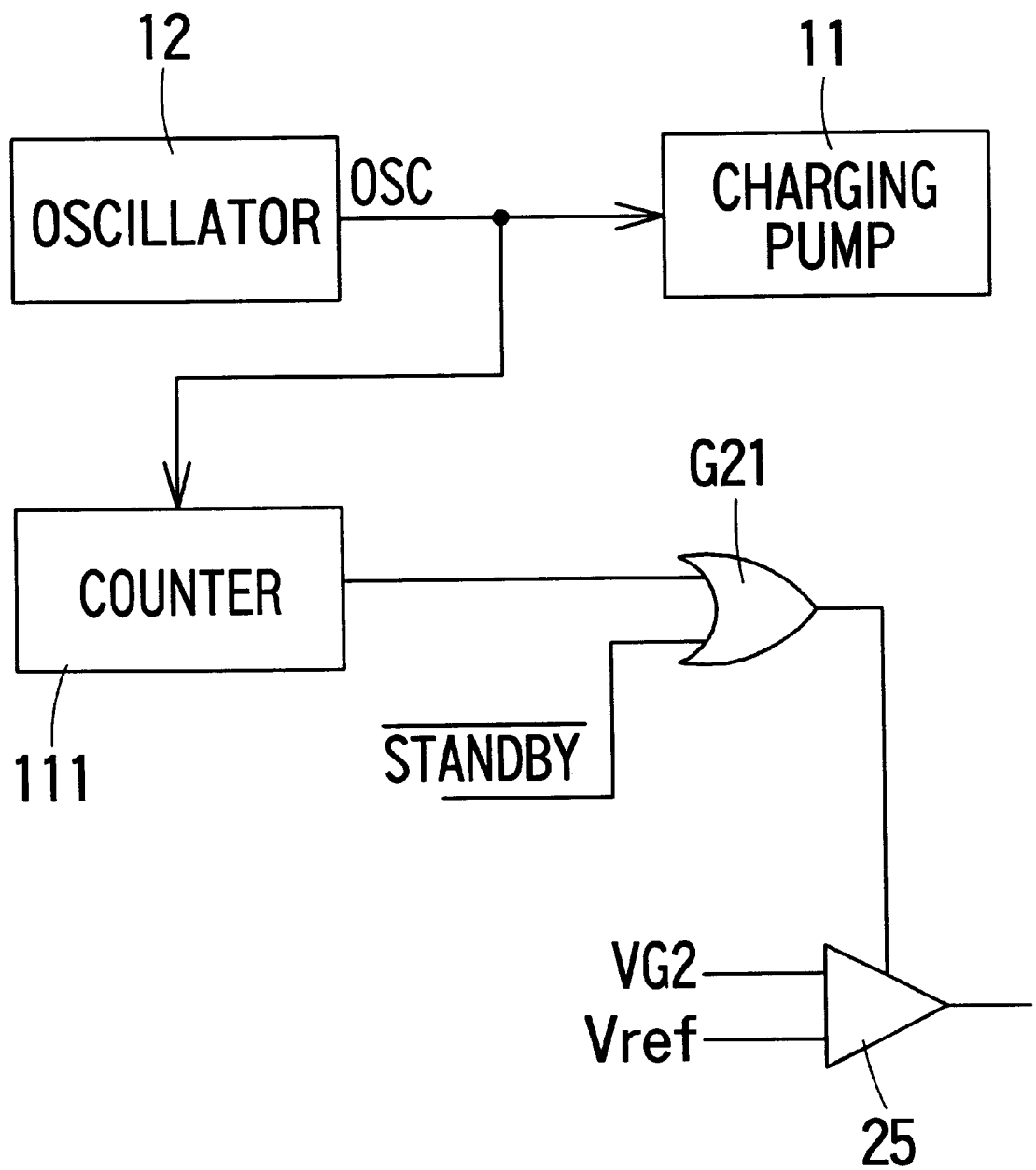
FIG. 6 is a circuit diagram of a modified embodiment for resetting a low power amplifier of FIG. 4.

The circuit for resetting the low power amplifier 25 should not be limited to the circuit shown in FIG. 4. For example, FIG. 6 shows an example that a counter 111 is provided, which outputs logic "1" when a predetermined number of pulses OSC are outputted from the oscillator 12, and the low power amplifier 25 may be reset by the output of the counter 111.

Furthermore, a plurality of charging pumps 11 may be connected in parallel, and only some of the charging pumps 11 may be driven during the stand-by state, so that the going-up degree of the stepped-up voltage Vccint2 during the stand-by state may be different from that during the memory access state.

Figure 7:
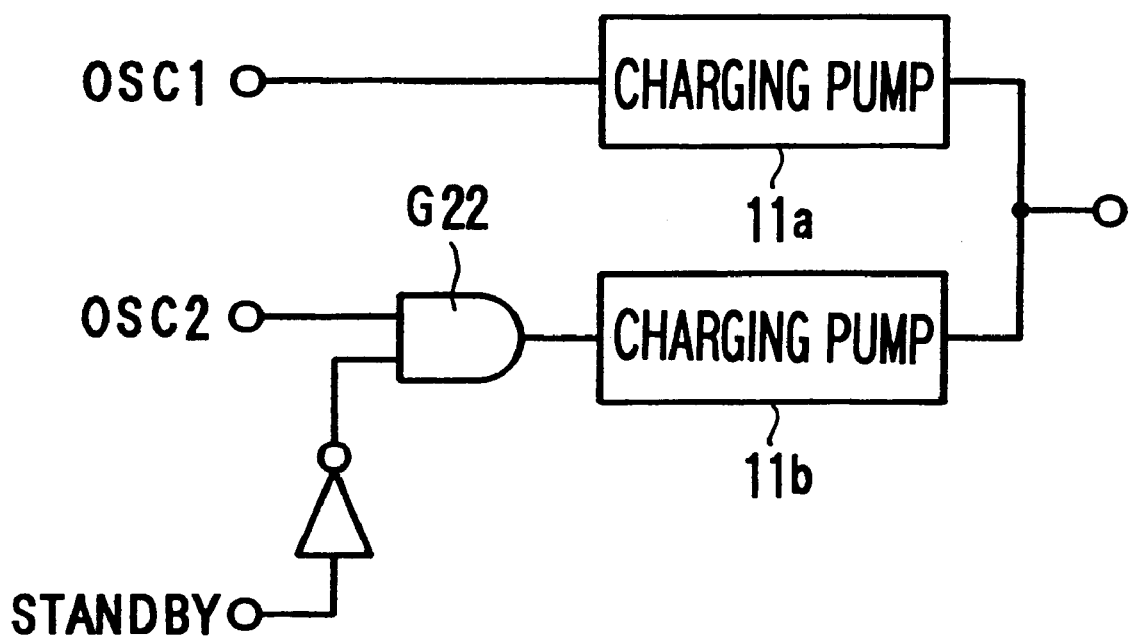
FIG. 7 is a diagram of an embodiment of a booster circuit having two charging pumps connected in parallel.

FIG. 7 shows an example of the booster circuit 1 wherein two charging pumps 11a, 11b are connected in parallel. The charging pumps 11a, 11b have the same circuit construction as that of FIG. 2. Signals OSC1, OSC2, the phases of which are shifted from each other to reduce noises, are inputted to the charging pumps 11a, 11b, respectively. An AND gate G22 is provided at the front stage of the charging pump 11b. The signal OSC2 and a signal becoming to a high level during the memory access state is inputted to the input terminal of the AND gate G22.

In the circuit of FIG. 7, although the charging pump 11a operates during both of the stand-by and memory access states, the charging pump 11b operates only during the memory access state and does not operate during the stand-by state. Therefore, the power (ability) of the whole charging pump decreases during the stand-by state in comparison with during the memory access state, so that the stepped-up voltage Vccint2 slowly increases.

The detailed construction of the internal voltage generating circuit 3 shown in FIG. 1 will be described below.

Figure 8:
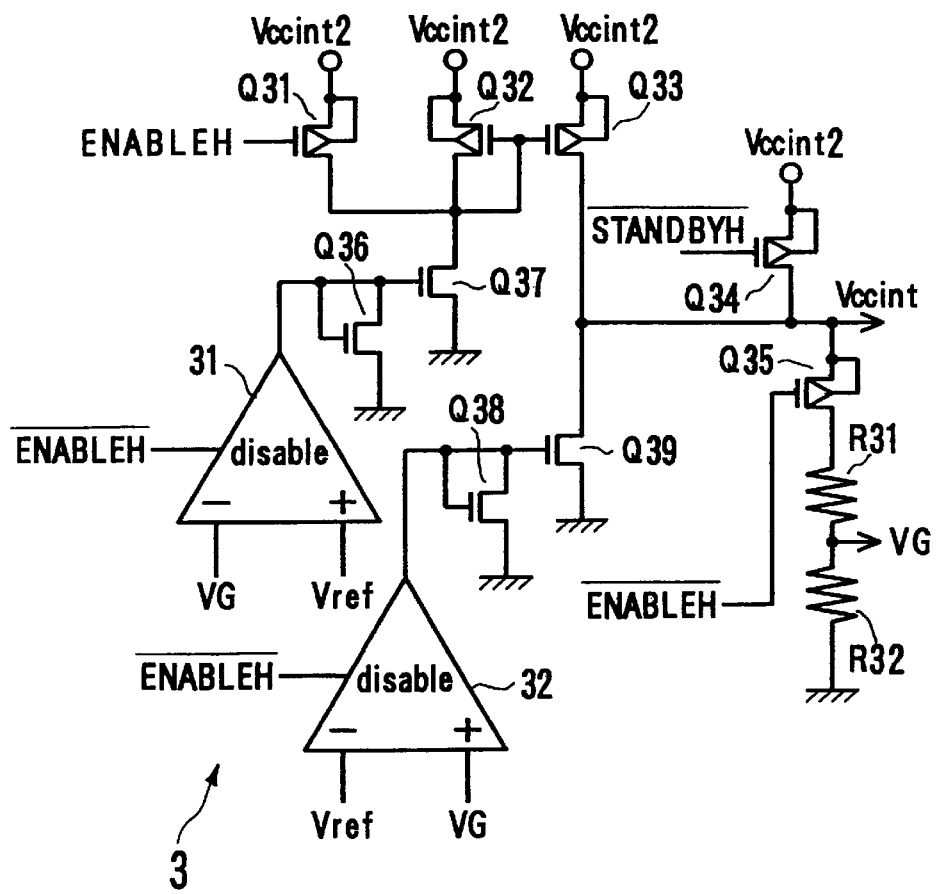
FIG. 8 is a circuit diagram illustrating the detailed construction of an internal voltage generating circuit.

FIG. 8 is a circuit diagram illustrating the internal voltage generating circuit 3. The internal voltage generating circuit 3 comprises differential amplifier 31, 32, PMOS transistors Q31 through Q35, NMOS transistors Q36 through Q39, resistors R31, R32, and generates an internal voltage Vccint on the basis of a stepped-up voltage Vccint2.

Each of the differential amplifiers 31, 32 compares a voltage VG, which is obtained by dividing an internal voltage Vccint by resistors, with a reference voltage Vref, and outputs the compared results. Specifically, the differential amplifier 31 controls so that the internal voltage Vccint goes up when the internal voltage Vccint is lower than 5 V, and the differential amplifier 32 controls so that the internal voltage Vccint goes down when the internal voltage Vccint is higher than 5 V.

Figure 9:
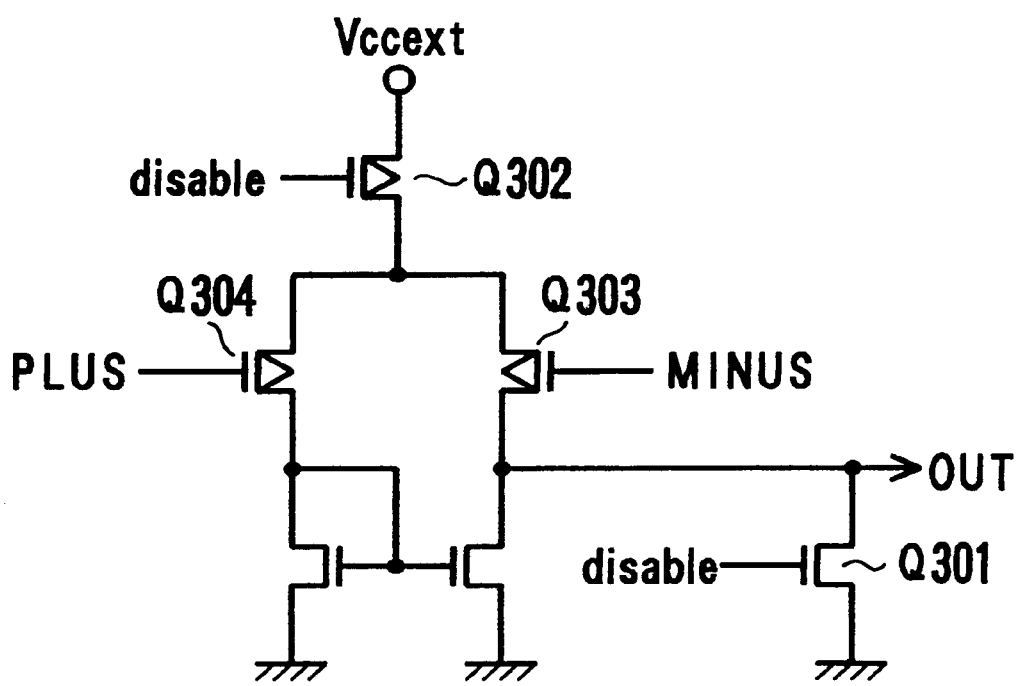
FIG. 9 is a circuit diagram illustrating the detailed construction of a differential amplifier in an internal voltage generating circuit.

Furthermore, each of the differential amplifiers 31, 32 comprises the same circuit as that of FIG. 9. The PLUS terminal of FIG. 9 corresponds to the (+) input terminal shown in FIG. 8, and the MINUS terminal of FIG. 9 corresponds to the (−) input terminal shown in FIG. 8. When the level of the disable terminal of FIG. 9 is a high level, the NMOS transistor Q301 is turned on, so that the output level is fixed to a low level. On the other hand, when the disable terminal is a low level, the PMOS transistor Q302 is turned on. In this state, if the voltage of the PLUS terminal is higher than that of the MINUS terminal, the current from the external power supply voltage Vccext flows through the PMOS transistor Q303, so that the output level becomes to a high level. Conversely, when the disable terminal is a high level, if the voltage of the MINUS terminal is higher than that of the PLUS terminal, the output level becomes to a low level.

The PMOS transistor Q34 is connected to the output stage of the internal voltage generating circuit 3 shown in FIG. 8. In the stand-by state, the transistor Q34 is turned on, so that the internal voltage Vccint is forcedly set to the stepped-up voltage Vccint2. That is, the PMOS transistor Q34 operates so as to short-circuit the internal voltage Vccint and the stepped-up voltage Vccint2 during the stand-by state.

By such control, during the memory access state, the internal voltage Vccint is set to about 5 V and the stepped-up voltage Vccint2 is set to about 6.5 V, and during the stand-by state, the internal voltage Vccint is set to the same voltage (5 V) as that of the stepped-up voltage Vccint2.

The internal voltage generating circuit 3 and the level detecting circuit 2, which are shown in FIG. 1, use a signal STANDBYH, which is obtained by level-shifting a signal STANDBY indicative of the stand-by state, and a signal ENABLEH, which is synchronized with the signal STANDBY. These signals are produced by means of a control signal producing circuit shown in FIG. 10.

Figure 10:
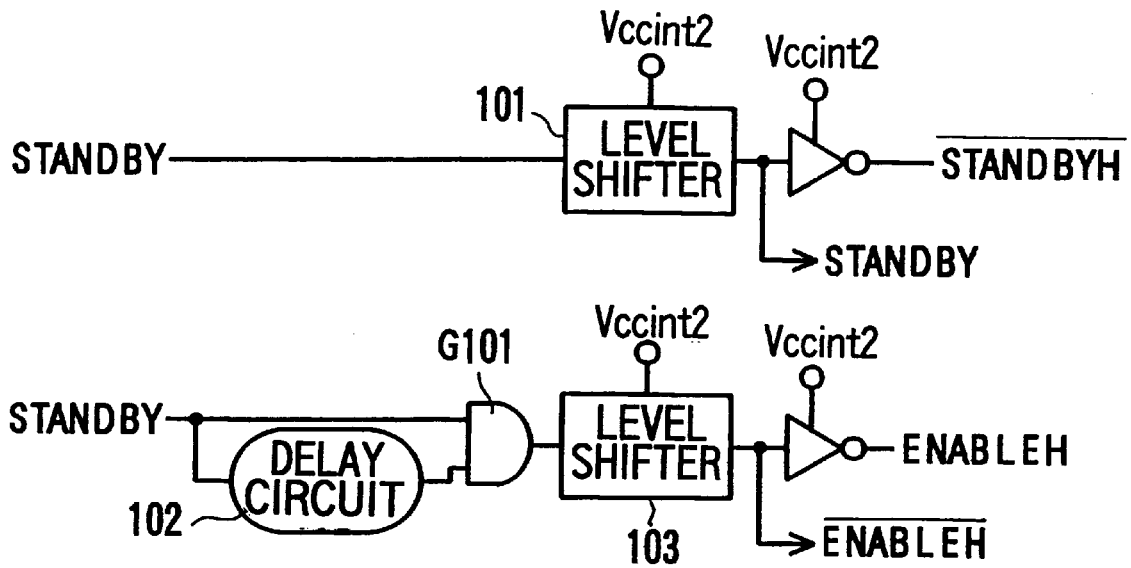
FIG. 10 is a circuit diagram illustrating the detailed construction of a control signal producing circuit.

In FIG. 10, the signal STANDBY, the level of which is a high level during the stand-by state, is inputted to a level shifter circuit 101 to be level-converted, so that the level shifter circuit 101 outputs the signal STANDBYH. In addition, the signal STANDBY and a signal, which is obtained by delaying the signal STANDBY by means of a delay circuit 102, are multiplied by means of an AND gate G101, and then, inputted to a level shifter 103 to generate the signal ENABLEH.

Figure 11:
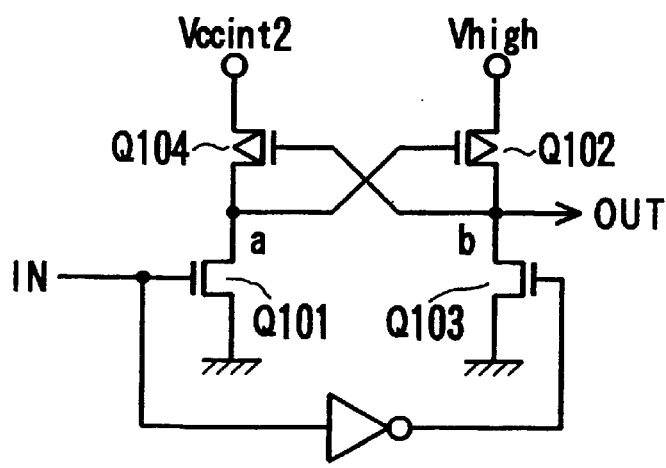
FIG. 11 is a diagram illustrating the detailed construction of a level shifter circuit of FIG. 10.

FIG. 11 is a circuit diagram illustrating the detailed constructions of the level shifter circuits 101, 103 shown in FIG. 10. When a high level signal is inputted to an input IN, an NMOS transistor Q101 is turned on, so that the level of point a becomes to a low level, and a PMOS transistor Q102 is also turned on, so that the level of an output OUT becomes to the same level as that of a power supply voltage Vhigh. In addition, when a low level signal is inputted to the input IN, an NMOS transistor Q103 is turned on, so that the level of the output OUT becomes to a ground level. Therefore, if the power supply voltage Vhigh is set to a predetermined voltage, an input signal can be level-converted.

Figure 12:
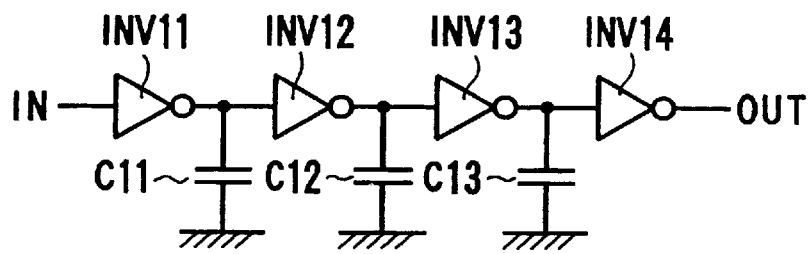
FIG. 12 is a circuit diagram illustrating the detailed construction of a delay circuit of FIG. 10.

FIG. 12 is a circuit diagram illustrating the detailed construction of the delay circuit 102 shown in FIG. 10. The delay circuit 102 comprises a plurality of inverters INV11 through INV14 connected in series, and capacitors C11 through C13 connected between the outputs of the respective inverters and the ground terminals. It is possible to obtain a desired delay time by changing the capacity of the capacitors and the number of the inverters connected in series.

Figure 13:
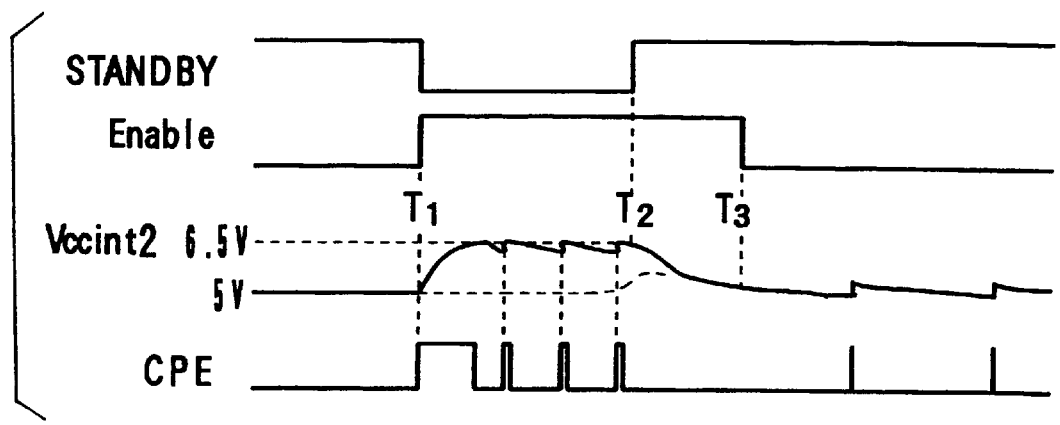
FIG. 13 is a waveform illustration showing the operation timing of the semiconductor integrated circuit device of FIG. 1.

FIG. 13 is a wave-form illustration showing the operation timing of the semiconductor integrated circuit device shown in FIG. 1. FIG. 13 shows the wave-forms of the signal STANDBY, the level of which is a high level during the stand-by state, the signal ENABLE synchronized with the signal STANDBY, the stepped-up voltage Vccint2 and the output signal CPE of the level detecting circuit 2. The level of the control signal ENABLE is changed to the high level when the operation state is changed to the memory access state, and to a low level after a while from the time when the operation state is changed to the stand-by state. Thus, the reason why the level of the signal ENABLE is changed to the low level after a while (time T3) from time T2 when the operation state is switched from the memory access state to the stand-by state is that the time required to go down the stepped-up voltage Vccint2 from 6.5 V to 5 V in the internal voltage generating circuit 3 is considered.

That is, during the stand-by state, the stepped-up voltage Vccint2 and the internal voltage Vccint are set to the same voltage (e.g., 5 V), and the level of the signal CPE is intermittently set to a high level so that the voltages do not fluctuate, and the charging pump 11 is driven every a few $\mu$ seconds to hundreds $\mu$ seconds.

On the other hand, when the operation state is changed from the stand-by state to the memory access state, it is required to go up the stepped-up voltage Vccint2 from 5 V to 6.5 V. Therefore, as shown in FIG. 13, the level of the output CPE of the oscillator 12 is maintained to the high level to continuously drive the charging pump 11 for a while after a point of time (time T1) when the operation state is changed to the memory access state. After the stepped-up voltage Vccint2 reached 6.5 V, the output CPE outputs a pulse in accordance with the going-down degree of the stepped-up voltage Vccint2 to control the stepped-up voltage Vccint so that it does not change from 6.5 V.

Figure 14:
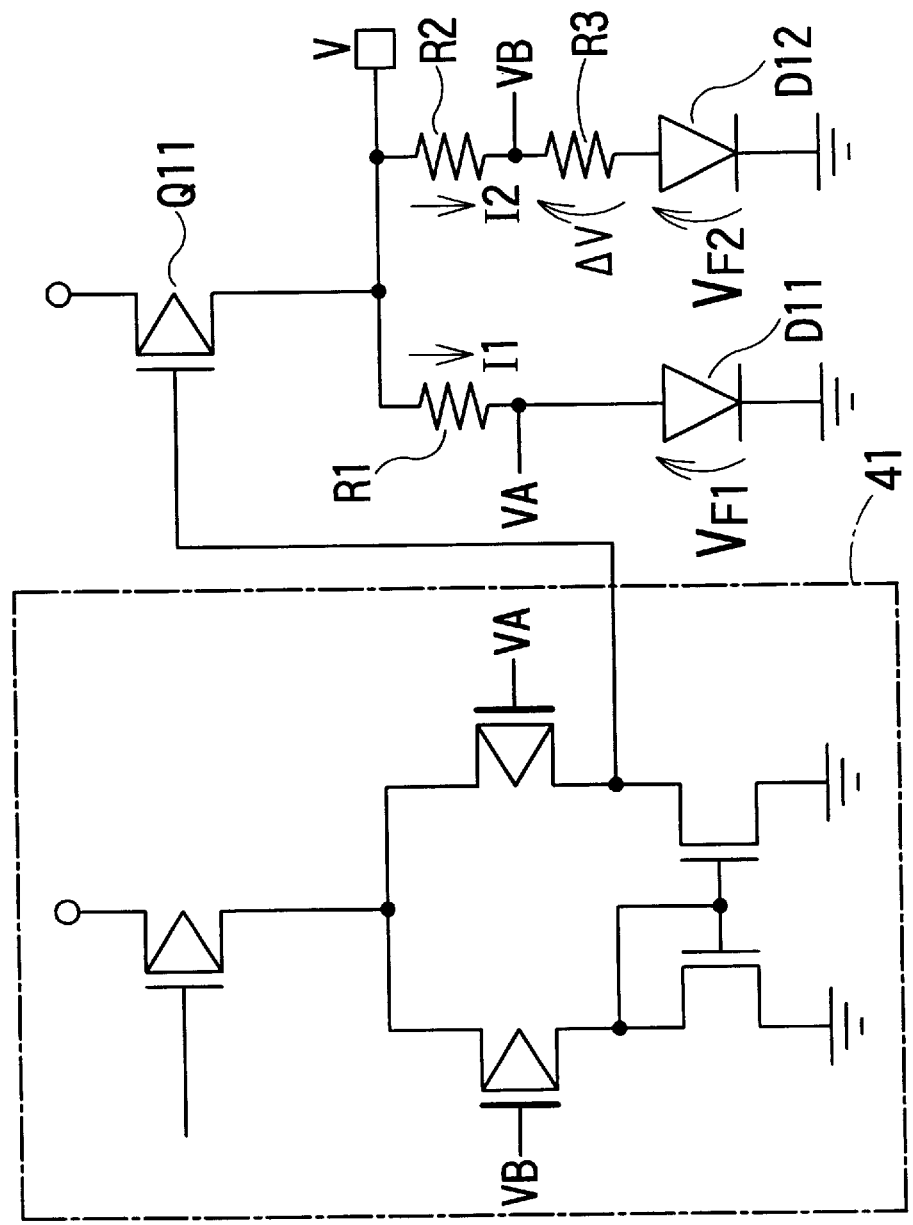
FIG. 14 is a circuit diagram illustrating the detailed construction of a reference voltage generating circuit.

By the way, the internal voltage generating circuit 3 shown in FIG. 8 uses a reference voltage Vref generated by means of a reference voltage generating circuit 30, the detailed construction of which is shown in FIG. 14. The reference voltage generating circuit 30 of FIG. 14 comprises a differential amplifier part 41, resistors R1, R2, R3, diodes D11, D12, and a PMOS transistor Q11. A constant current from a constant current source 42 is supplied to the differential amplifier part 41. The differential amplifier part 41 controls so that a voltage VA at the node of the resistor R1 and the diode D11 becomes equal to a voltage VB at the node of the resistors R2 and R3.

Therefore, the relationship between current I1 flowing through the resistor R1 and current I2 flowing through the resistor R2 can be expressed by equation (1).

$$I1/I2 = R1/R2 \tag{1}$$

In general, assuming that current flowing through a diode is I, a (reverse) saturation current is Is, a forward voltage is VF, and temperature is T, the relationship expressed by equation (2) can be established.

$$I = Is\{\exp(q \cdot VF/kT) - 1\} \tag{2}$$

Since VF>>>q/kT=26 mV, (−1) in the equation (2) can be ignored, so that equation (3) can be established.

$$I = Is \cdot \exp(q \cdot VF/kT) \tag{3}$$

When the equation (3) is modified, equation (4) can be obtained, where VT=kT/q.

$$VF = (kT/q) \cdot \ln(I/Is) \tag{4}$$

Assuming that the forward voltages of the diodes D11 and D12 of FIG. 14 are VF1 and VF2, respectively, and the voltage applied between both ends of the resistor R3 is $\Delta V$, the relationship expressed by equation (5) can be established.

$$\Delta VF = VF1 - VF2 = VT \cdot \ln(I1/I2) = VT \cdot \ln(R2/R1) \tag{5}$$

From the equation (5), the reference voltage Vref can be expressed by equation (6).

$$Vref = VF1 + (R2/R3)\Delta VF \tag{6}$$

The voltage VT has a positive temperature coefficient of 0.086 mV/° C., and the forward voltage VF1 of the diode D11 has a negative temperature coefficient of about −2 mV/° C. Therefore, if the values of resistance of the resistors R2, R3 are set so as to eliminate the temperature dependency, the reference voltage Vref is always a constant voltage value independent of temperature.

In order to reduce the power consumption of the reference voltage generating circuit 30 of FIG. 14, it is desirable to reduce the current by means of the constant current source for supplying current to the reference voltage generating circuit 30. The constant current source may be provided for the exclusive use of the resistance voltage generating circuit, or the constant current source part 27 in the low power amplifier 25 of FIG. 5 may be commonly used.

Figure 15:
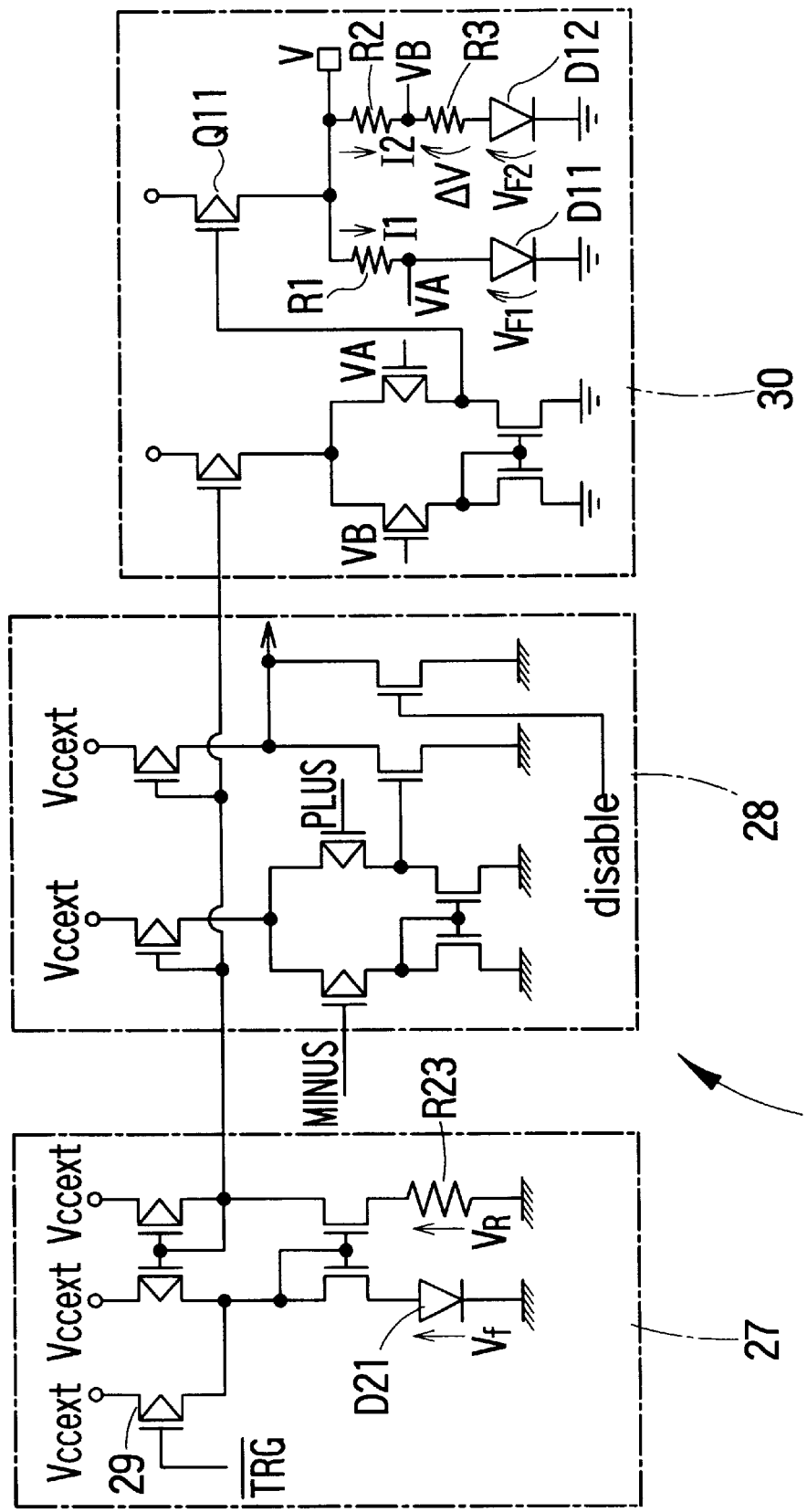
FIG. 15 is a diagram illustrating an embodiment of a constant current source part in the second level detecting circuit, which is applied to a reference voltage generating circuit.

FIG. 15 shows an example that the low power consumption type constant current source part 27 in the low power amplifier 25 of FIG. 5 is commonly used for the reference voltage generating circuit 30. The constant current source part 27 is shown by a dot-and-dashed line in FIG. 15. The current outputted from the constant current source part 27 is inputted to the differential amplifier part 28 forming the low power amplifier 25 as well as to the reference voltage generating circuit 30, which outputs the reference voltage Vref.

Thus, if the reference voltage Vref is generated by utilizing the constant current source part 27 in the second level detecting part 22 shown in FIG. 4, it is not required to separately provide the constant current source part 27, so that it is possible to simplify the circuit. In addition, since the constant current source part 27 in the second level detecting part 22 has low power consumption, it is possible to reduce the power consumption of the whole reference voltage generating circuit 30.

Second Preferred Embodiment

In the first preferred embodiment, as shown in FIG. 8, during the stand-by state, the transistor Q34 in the internal voltage generating circuit 3 is turned on to forcedly short-circuit the internal voltage Vccint and the stepped-up voltage Vccint2.

Figure 16:
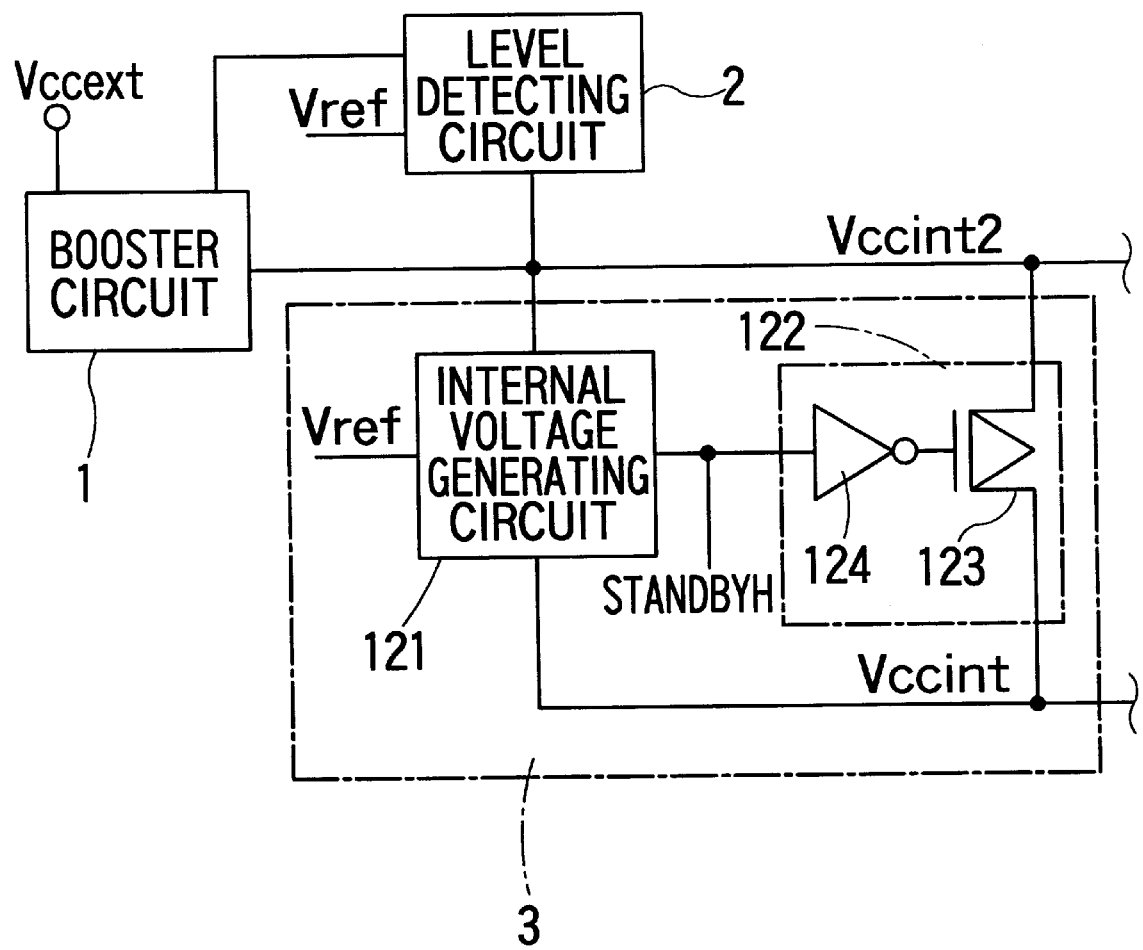
FIG. 16 is a block diagram schematically illustrating a semiconductor integrated circuit to be compared with second embodiment of a semiconductor integrated circuit.

FIG. 16 is a block diagram illustrating the schematic constructions of the booster circuit 1 and the output stage of an internal voltage generating circuit 3. The internal voltage generating circuit 3 comprises an internal voltage generating part 121 for lowering a stepped-up voltage Vccint2 to generate an internal voltage Vccint, and a switch circuit 122. The switch 122 comprises a PMOS transistor 123 and an inverter 124. The PMOS transistor 123 is turned on and off in accordance with logic of a signal STANDBYH, the level of which is a high level during the stand-by state. Specifically, during the stand-by state, the PMOS transistor 123 is turned on to forcedly short-circuit the output terminals of the booster circuit 1 and the internal voltage generating part 121, so that the stepped-up voltage Vccint 2 becomes equal to the internal voltage Vccint.

Although the internal voltage Vccint is a substantially constant voltage (about 5 V) independent of the operation state of the memory, the stepped-up voltage Vccint2 is about 6.5 V during the memory access state and about 5 V during the stand-by state. Therefore, as shown in FIGS. 8 and 16, if the output terminals of the booster circuit 101 and the internal voltage generating part 103 are forcedly short-circuited when the operation state is changed to the stand-by state, the internal voltage Vccint rises temporarily under the influence of the stepped-up voltage Vccint2 after the operation state is changed to the stand-by state. Therefore, for a while after the time when the operation state is changed to the stand-by state, i.e., until the stepped-up voltage Vccint2 goes down, the control lowering the internal voltage Vccint has to be performed by means of the differential amplifier and so on in the internal voltage generating circuit 3, so that the power consumption of the whole memory may be increased.

Some of flash memories have a CE short cycle mode for switching the operation mode between the memory access state and the stand-by state in accordance with logic of a chip enable signal. Since the operation mode is periodically switched between the memory access state and the stand-by state in the CE short cycle mode, the operation state is switched to the stand-by state before the internal voltage Vccint goes down until 5 V during the memory access state, so that the internal voltage Vccint rises. This operation is repeated, so that the internal voltage Vccint may finally rise to a maximum of 6.5 V. Since the internal voltage Vccint is supplied to word lines in the memory chip, the readout voltage of the word lines is also a maximum of 6.5 V, so that data written in the memory may not be correctly read out.

Figure 17:
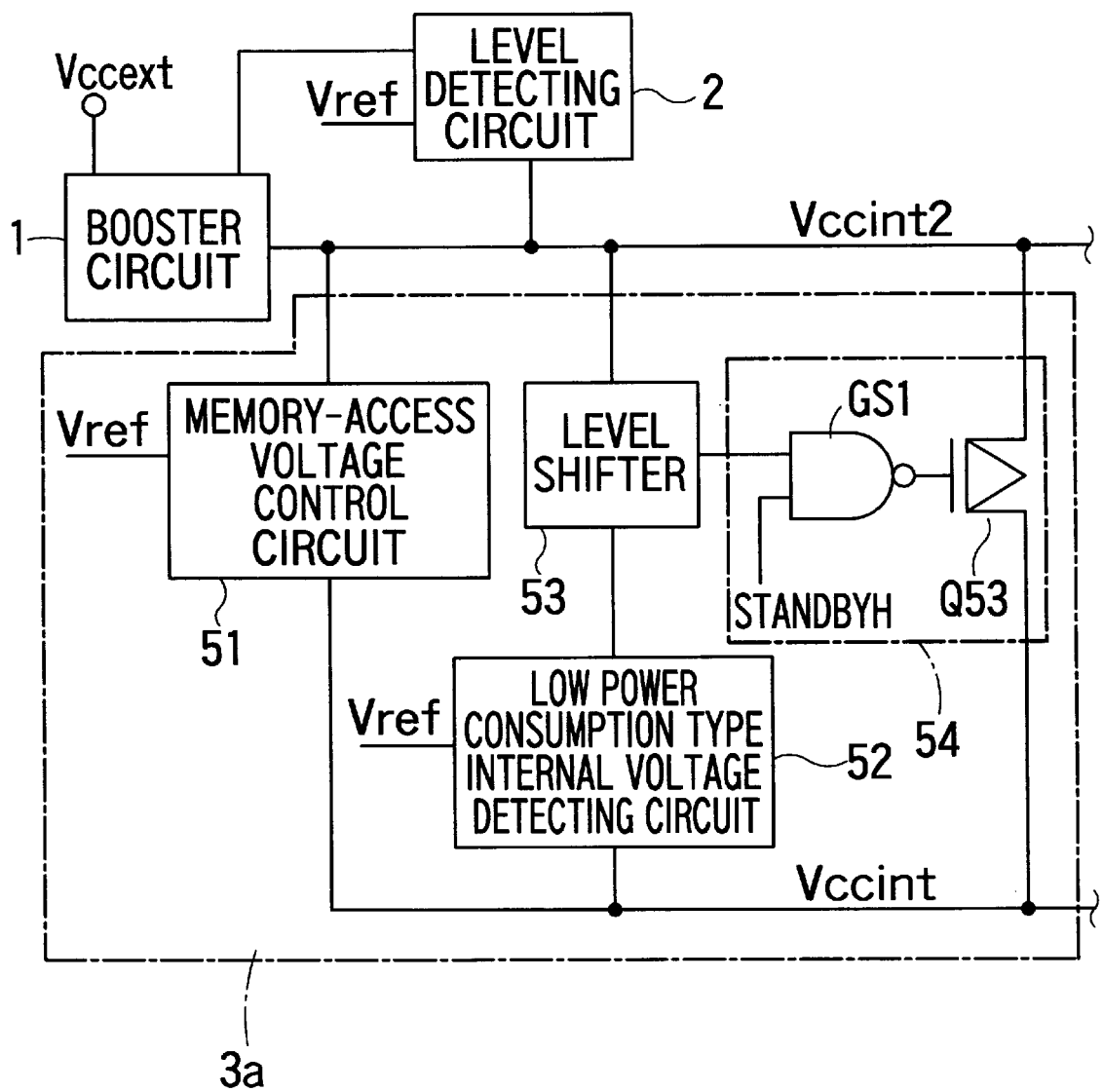
FIG. 17 is a schematic block diagram of the second preferred embodiment of a semiconductor integrated circuit device according to the present invention.

On the other hand, a semiconductor integrated circuit device schematically shown in FIG. 17 is formed so that an internal voltage Vccint does not fluctuate immediately after the operation state is changed to the stand-by state. FIG. 17 shows a part of an internal construction of an EEPROM, i.e., a circuit block for raising an external power supply voltage Vccext to generate a stepped-up voltage Vccint2, and a circuit block for generating an internal voltage Vccint from the stepped-up voltage Vccint2. The EEPROM of FIG. 17 has substantially the same construction as that in the first preferred embodiment, except for the construction of an internal voltage generating circuit 3a. Therefore, the construction of the internal voltage generating circuit 3a will be mainly described below.

The internal voltage generating circuit of FIG. 17 comprises a memory-access voltage control circuit 51, a low power consumption type internal voltage detecting circuit 52, a level shifter 53 and a switch circuit 54. The memory-access voltage control circuit 51 generates an internal voltage Vccint during the memory access state, and controls the internal voltage so that it does not fluctuate. The low power consumption type internal voltage detecting circuit 52 outputs a signal in accordance with the voltage level of the internal voltage Vccint. Specifically, the low power consumption type internal voltage detecting circuit 52 outputs a high level signal when the internal voltage Vccint is higher than a predetermined voltage, and a low level signal when the voltage Vccint is lower than the predetermined voltage. This signal is inputted to the level shifter 53 to be level-converted, and then, inputted to the switch circuit 54. The switch circuit 54 is always in an OFF state during the memory access state, and it is turned on to short-circuit the stepped-up voltage Vccint2 and the internal voltage Vccint when the internal voltage Vccint is lower than or equal to the predetermined voltage during the stand-by-state.

Figure 18:
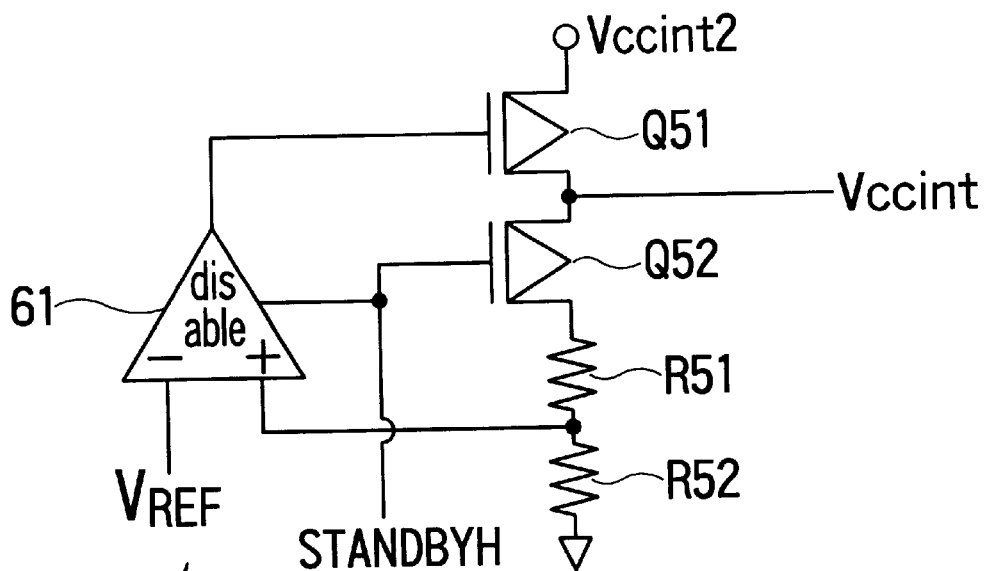
FIG. 18 is a circuit diagram illustrating the detailed construction of a memory-access voltage control circuit.

FIG. 18 is a circuit diagram illustrating the detailed construction of the memory-access voltage control circuit 51. As shown in FIG. 18, the memory-access voltage control circuit 51 comprises a differential amplifier 61, PMOS transistors Q51, Q52, and resistors R51, R52. A stepped-up voltage Vccint2 is applied to the source terminal of the PMOS transistor Q51, and an internal voltage Vccint is outputted from the connecting point of the drain terminal of the PMOS transistor Q51 and the source terminal of the PMOS transistor Q52. Between the drain terminal of the PMOS transistor Q52 and the ground terminal, the resistors R51 and R52 are connected in series. A signal STANDBYH is applied to the gate terminal of the PMOS transistor Q52. The output terminal of the differential amplifier 61 is connected to the gate terminal of the PMOS transistor Q51. The differential amplifier 61 operates only during the memory access state. The voltage between the resistors R51 and R52 is applied to the positive-side input terminal of the differential amplifier 61, and a reference voltage Vref is applied to the negative-side input terminal.

During the memory access state, the PMOS transistor Q52 is turned on, and a voltage obtained by dividing the internal voltage Vccint by the resistors R51 and R52 is inputted to the positive-side input terminal of the differential amplifier 61. For example, when the internal voltage Vccint is higher than a predetermined voltage, the voltage of the positive-side input terminal of the differential amplifier 61 becomes higher than that of the negative-side input terminal thereof, and the output voltage of the differential amplifier 61 rises, so that the PMOS transistor Q51 operates so as to be turned off to lower the internal voltage Vccint. Conversely, when the internal voltage Vccint is lower than the predetermined voltage, the voltage of the positive-side input terminal of the differential amplifier 61 is lower than that of the negative-side input terminal thereof to go down the output voltage of the differential amplifier 61, so that the PMOS transistor Q51 operates so as to be turned on to raise the internal voltage Vccint. By such control, the internal voltage Vccint is controlled so as to be set to a predetermined voltage during the memory access state.

On the other hand, during the stand-by state, the PMOS transistor Q52 is turned off and the differential amplifier 61 is deactivated, so that the internal voltage Vccint gradually goes down due to wiring resistance and so forth. The voltage level of the internal voltage Vccint during the stand-by state is detected by means of the low power consumption type internal voltage detecting circuit 52 shown in FIG. 17.

Figure 19:
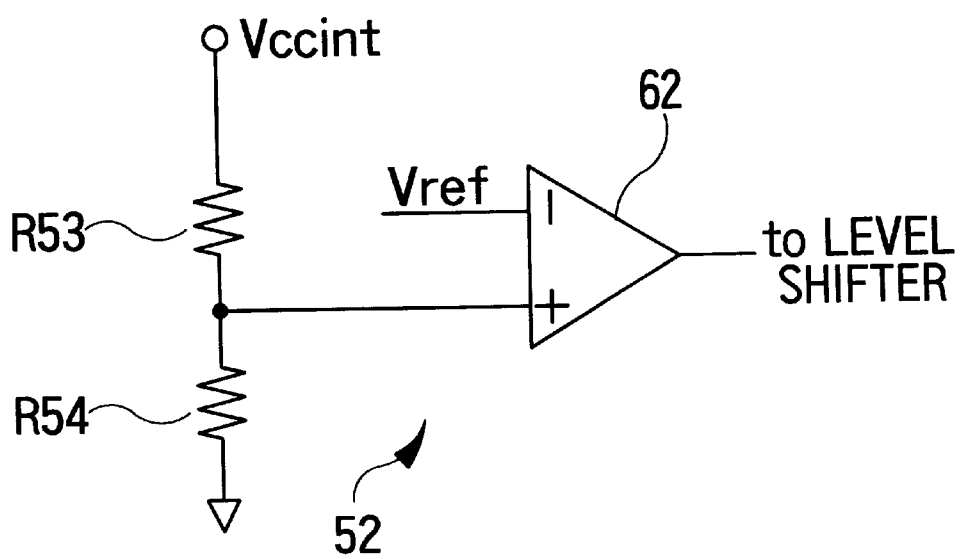
FIG. 19 is a circuit diagram illustrating the detailed construction of a low power consumption type internal voltage detecting circuit.

FIG. 19 is a circuit diagram illustrating the detailed construction of the low power consumption type internal voltage detecting circuit 52. As shown in FIG. 19, the low power consumption type internal voltage detecting circuit 52 comprises a low power amplifier 62 having the same construction as that of FIG. 4, and resistors R53, R54. The internal voltage Vccint is applied to one end of the resistors R53, R54 connected in series, and the other end thereof is grounded. A voltage between the resistors R53, R54 is applied to the positive-side input terminal of the low power amplifier 62, and a reference voltage Vref is applied to the negative-side input terminal thereof. The output of the low power amplifier 62 is supplied to the level shifter 53 shown in FIG. 17.

For example, when the internal voltage Vccint becomes higher than a predetermined voltage during the stand-by state, the output level of the low power amplifier 62 becomes to a low level. Conversely, when the internal voltage Vccint becomes lower than or equal to the predetermined voltage during the stand-by state, the output level of the lower power amplifier 62 becomes to a high level. Since the low power amplifier 62 has lower current consumption than that of an ordinary differential amplifier, it is possible to reduce the power consumption during the stand-by state.

The level shifter 53 shown in FIG. 17 comprises the same circuit as that of FIG. 11, and level-converts the output voltage of the low power amplifier 62. The level-converted voltage is inputted to the NAND gate G51 in the switch circuit 54. The output level of the NAND gate G51 is always a high level during the memory access, so that the PMOS transistor Q53 is maintained to be in OFF state. Even during the stand-by state, when the output level of the level shifter 53 is a low level, i.e., when the internal voltage Vccint is higher than a predetermined voltage, the output level of the NAND gate G51 becomes to a high level. On the other hand, when the internal voltage Vccint is lower than or equal to the predetermined voltage during the stand-by state, the output level of the NAND gate G51 becomes to a low level, so that the PMOS transistor Q53 is turned on to short-circuit the stepped-up voltage Vccint2 and the internal voltage Vccint.

Figure 20:
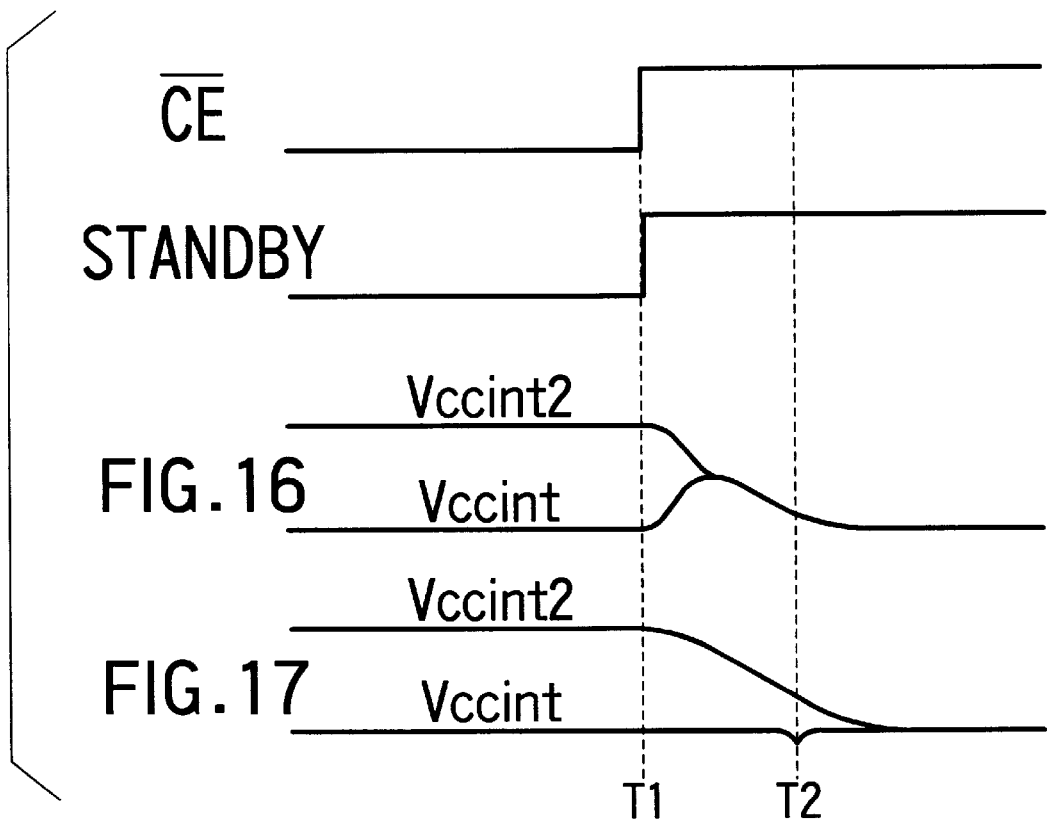
FIG. 20 is a timing chart showing the variations in a stepped-up voltage and an internal voltage when the operation state is switched from a memory access state to a stand-by state.

FIG. 20 is a timing chart showing the state that the stepped-up voltage Vccint2 and the internal voltage Vccint vary when the operation state is changed from the memory access state to the stand-by state. In FIG. 20, CE bar denotes a chip enable signal of an EEPROM.

Referring to the timing chart of FIG. 20, the operation of the second preferred embodiment shown in FIG. 17 will be described below.

The operation of the booster circuit 1 is the same as that in the first preferred embodiment. On the basis of an external power supply voltage Vccext of, e.g., 3 V, the booster circuit 1 generates a stepped-up voltage Vccint2 of about 6.5 V during the memory access state, and of about 5 V during the stand-by state. The operation of the internal voltage generating circuit 3a is also the same as that in the first preferred embodiment during the memory access state, and generates an internal voltage Vccint of about 5 V on the basis of a stepped-up voltage Vccint2 of about 6.5 V.

On the other hand, when the operation state is changed from the memory access state to the stand-by state (time T1 in FIG. 20), the operation of the memory-access voltage control circuit 51 shown in FIG. 17 is stopped, and the operation of the low power consumption type internal voltage detecting circuit 52 is started. The low power consumption type internal voltage detecting circuit 52 detects whether the voltage value of the internal voltage Vccint becomes equal to a predetermined voltage. While the internal voltage Vccint is higher than the predetermined voltage, the PMOS transistor Q53 in the switch circuit 54 is in OFF state. During the stand-by state, since the booster circuit 1 controls the stepped-up voltage Vccint2 so that it goes down from 6.5 V to 5 V, the stepped-up voltage Vccint2 gradually goes down. Also, the internal voltage Vccint gradually goes down due to wiring resistance and so forth.

Then, when the internal voltage Vccint becomes lower than or equal to the predetermined voltage (time T2 in FIG. 20), the PMOS transistor Q53 is turned on to short-circuit the stepped-up voltage Vccint2 and the internal voltage Vccint. When the stepped-up voltage Vccint2 and the internal voltage Vccint short-circuit, the internal voltage Vccint may unreasonably go up under the influence of the stepped-up voltage Vccint2. According to the circuit in FIG. 17, when the internal voltage Vccint is raised to the predetermined voltage, the PMOS transistor Q53 is turned off again, so that the still more rise of the internal voltage Vccint is restrained.

Figure 21:
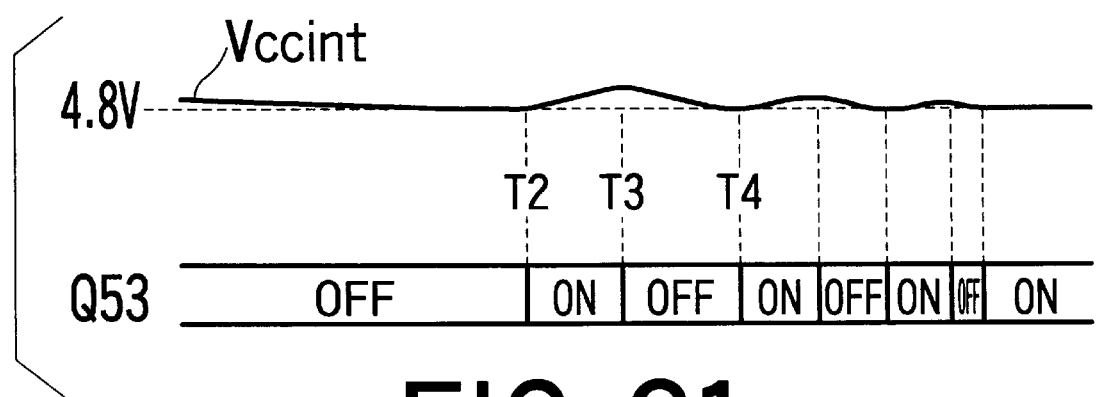
FIG. 21 is an enlarged timing chart near time T2 of FIG. 20.

FIG. 21 is an enlarged timing chart near time T2 of FIG. 20, and shows the output wave-forms of the internal voltage Vccint and the PMOS transistor. As shown in FIG. 21, when the PMOS transistor Q53 is turned on at time T2, the stepped-up voltage Vccint2 and the internal voltage Vccint is short-circuited to raise the internal voltage Vccint, and the PMOS transistor Q53 is turned off again at time T3. When the PMOS transistor Q53 is turned off, the internal voltage Vccint goes down, and the PMOS transistor Q53 is turned on again at time T4, so that the stepped-up voltage Vccint2 and the internal voltage Vccint is short-circuited. By repeating such operation, the internal voltage Vccint converges at a predetermined voltage (e.g., 5 V).

FIG. 20 illustrates an internal voltage wave-form in the circuit in FIG. 17 and the wave-form in the circuit in FIG. 16 to be compared with the circuit in FIG. 17. It can be seen from FIG. 20 that although the conventional internal voltage Vccint temporarily goes up immediately after the operation state is changed to the stand-by state, the internal voltage Vccint in the second preferred embodiment is substantially constant.

Third Preferred Embodiment

The third preferred embodiment has a feature in which a circuit for detecting the voltage level of a stepped-up voltage Vccint2 is commonly used for a circuit for detecting the voltage level of an internal voltage Vccint.

Figure 22:
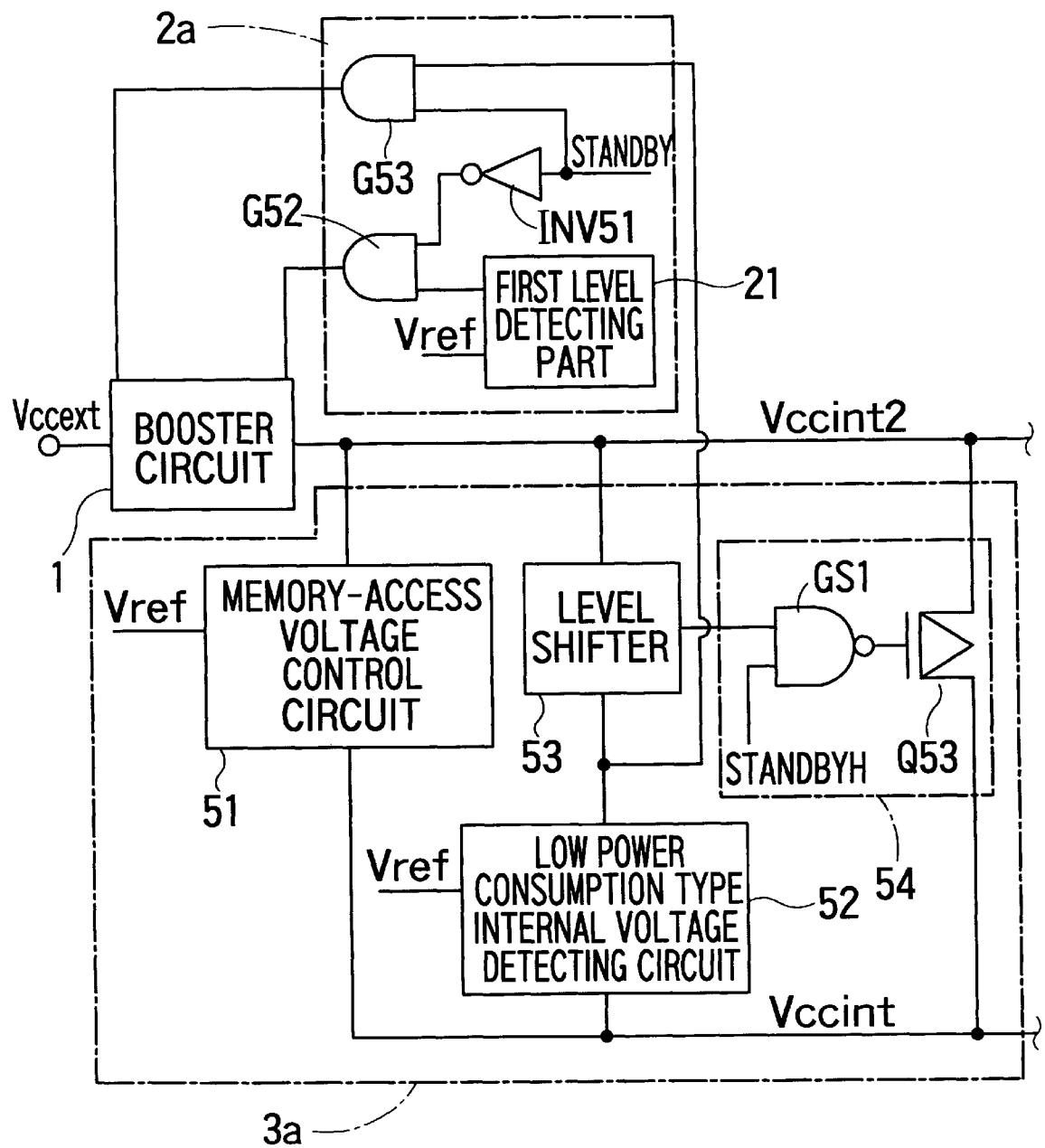
FIG. 22 is a schematic block diagram of the third preferred embodiment of a semiconductor integrated circuit diagram according to the present invention.

FIG. 22 is a schematic block diagram of the third preferred embodiment of a semiconductor integrated circuit device according to the present invention. The semiconductor integrated circuit device of FIG. 22 has substantially the same construction as that of FIG. 17, except for a level detecting circuit 2a for detecting the voltage level of a stepped-up voltage Vccint2. Therefore, the construction of the level detecting circuit 2a will be mainly described.

The level detecting circuit 2a of FIG. 22 comprises a first level shifter 21 shown in FIG. 4, AND gates G52, G53, and an inverter INV51. The booster circuit 1 controls the stepped-up voltage Vccint2 in accordance with the output of the AND gate G52 during the memory access state, and in accordance with the output of the AND gate G53 during the stand-by state. The AND gate G52 directly outputs the output of the first level detecting part 21 during the memory access state. The AND gate G53 directly outputs the output of the low power consumption type internal voltage detecting circuit 52 during the stand-by state.

The operation of the third preferred embodiment will be described below.

During the memory access state, the booster circuit 1 controls the level of the stepped-up voltage Vccint2 on the basis of the detected results of the first level detecting part 21. During the stand-by state, the booster circuit 1 controls the level of the stepped-up voltage Vccint2 on the basis of the detected results of the low power consumption type internal voltage detecting circuit 52 for detecting the voltage level of the internal voltage Vccint, since the stepped-up voltage Vccint2 and the internal voltage Vccint are short-circuited. Therefore, it is not required to provide the low power consumption type level detecting circuit 22 of FIG. 4, which is exclusively used during the stand-by state, in the level detecting circuit 2a, so that it is possible to simplify the circuit construction and reduce the power consumption.

Fourth Preferred Embodiment

The fourth preferred embodiment has a feature in which the driving force of a booster circuit is switched between during the memory access state and during the stand-by state.

Figure 23:
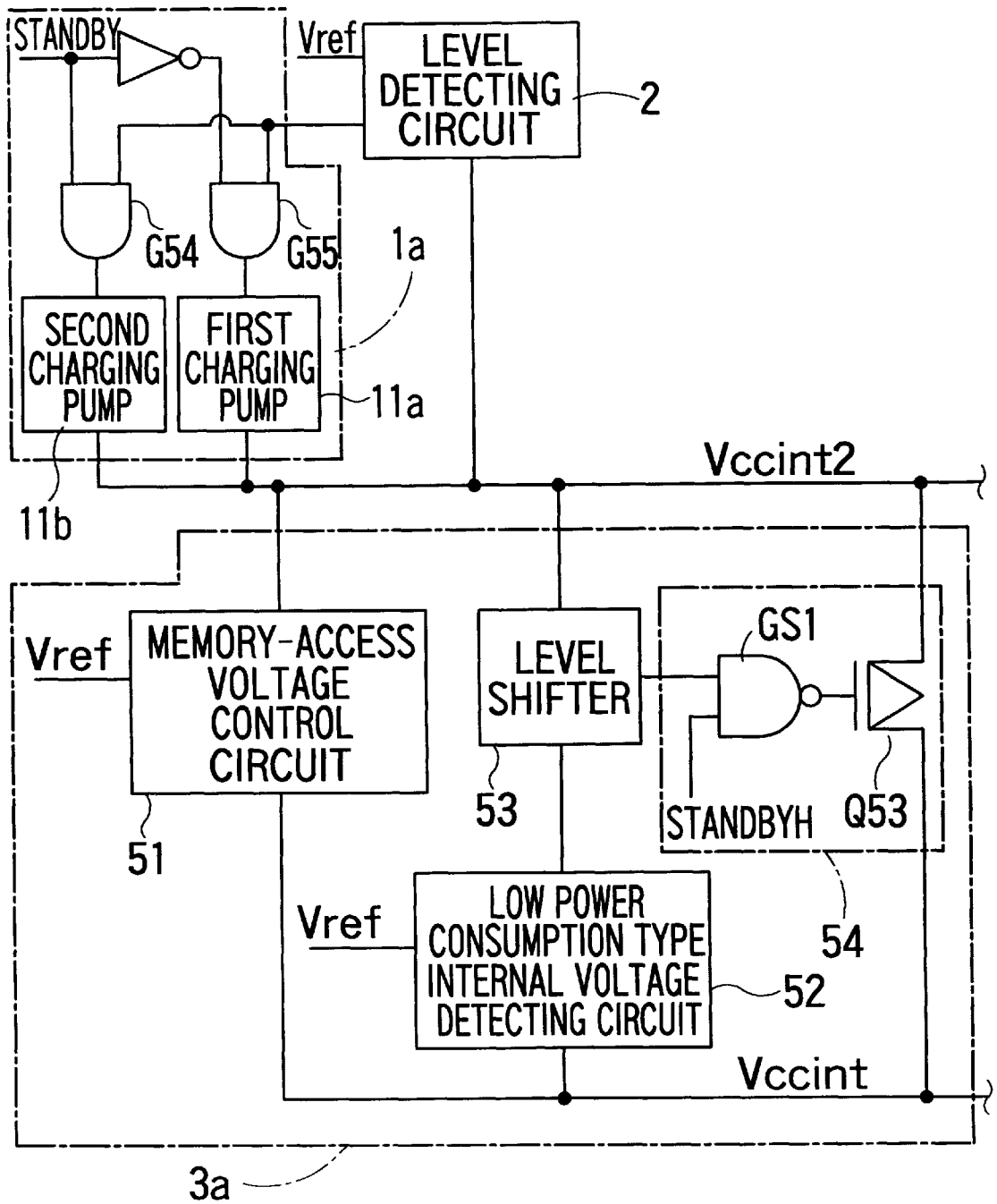
FIG. 23 is a schematic block diagram of the fourth preferred embodiment of a semiconductor integrated circuit diagram according to the present invention.

FIG. 23 is a schematic block diagram of the fourth preferred embodiment of a semiconductor integrated circuit device according to the present invention. The fourth preferred embodiment is substantially the same as the second preferred embodiment, except that the construction of a booster circuit 1a is different from that in the second preferred embodiment shown in FIG. 17. Therefore, the construction of the booster circuit 1a will be mainly described below.

The booster circuit 1a of FIG. 23 comprises a first charging pump 11a for generating a stepped-up voltage Vccint2 during the memory access state, and a second charging pump 11b for generating a stepped-up voltage Vccint2 during the stand-by state. Although each of the charging pumps has the same circuit construction as that of FIG. 2, the charge supply ability of the first charging pump 11a is higher than that of the second charging pump. Thus, one of the method to set the charge supply abilities to be different from each other is to change the -capacity of capacitors in the charging pump.

During the memory access state, since the output level of the AND gate G54 is fixed to a low level, the second charging pump 11b is not activated. On the other hand, the output of the level detecting circuit 2 is directly outputted from the AND gate G55, and the first charging pump 11a controls the level of the stepped-up voltage Vccint2 in accordance with the output of the level detecting circuit 2.

Conversely, during the stand-by state, since the output level of the AND gate G55 is fixed to a low level, the first charging pump 11a is not activated. On the other hand, the output of the level detecting circuit 2 is directly outputted from the AND gate G54, and the second charging pump 11b controls the level of the stepped-up voltage Vccint2 in accordance with the output of the level detecting circuit 2.

Thus, in the fourth preferred embodiment, since the stepped-up voltage Vccint2 is generated by the charging pump 11b having low charge supply ability (low driving force) when the operation state is changed to the stand-by state, it is possible to reduce a peak current during the stand-by state, so that it is possible to reduce the power consumption.

Figure 24:
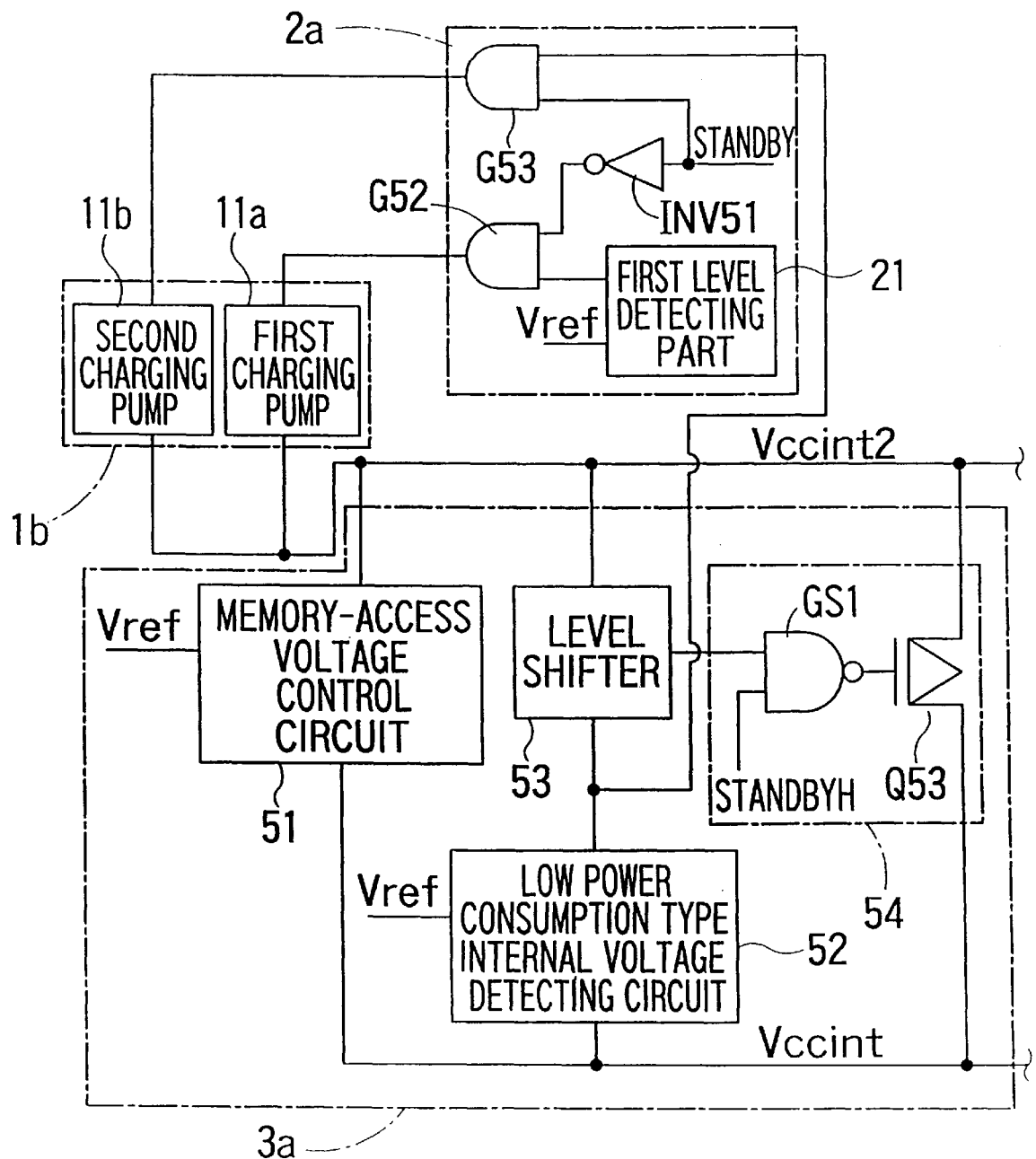
FIG. 24 is a block diagram of a semiconductor integrated diagram wherein a booster circuit 1 of FIG. 22 is substituted for a booster circuit 1a of FIG. 23.
Figure 25:
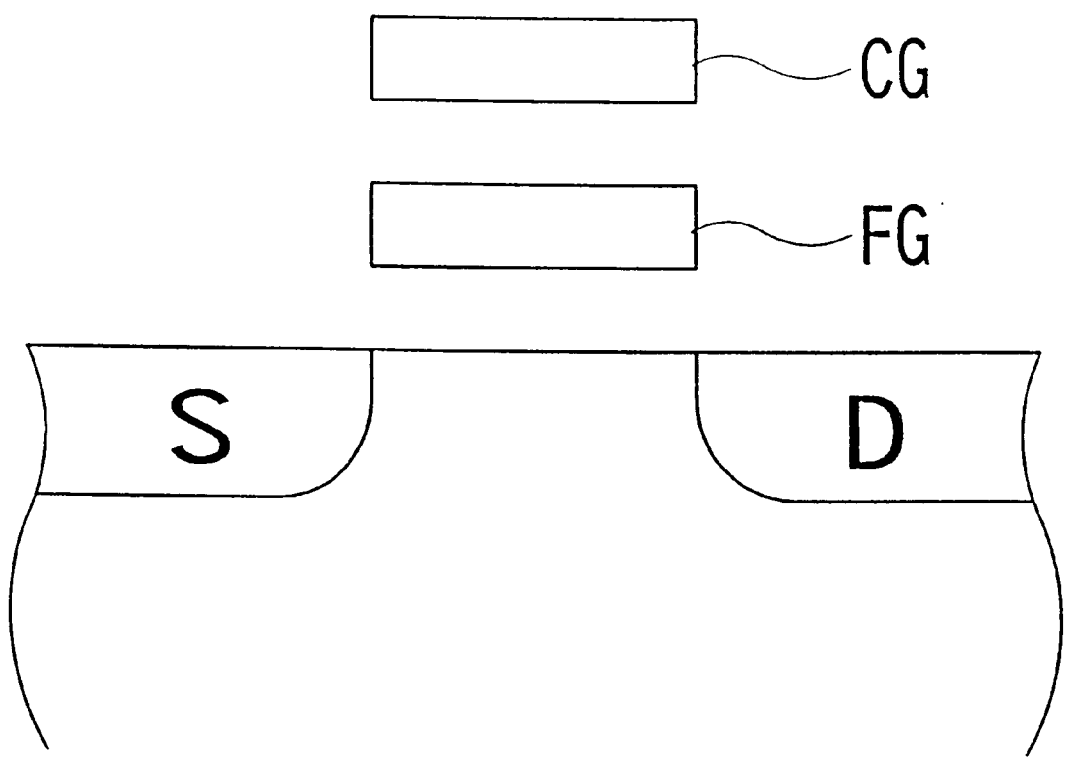
FIG. 25 is a diagram illustrating the structure of a conventional non-volatile semiconductor memory.

Furthermore, the booster circuit 1 of FIG. 22 may be replaced by the booster circuit of FIG. 23 as schematically shown in FIG. 24. The construction of FIG. 24 has the same advantageous effects as those of FIG. 23. Similarly, the booster circuit 1 in the first preferred embodiment shown in FIG. 1 may be replaced by the booster circuit 1a of FIG. 23.

In the above described preferred embodiments, while the voltage Vccext supplied from the outside has been lowered by means of the internal voltage generating circuit 3 after being temporarily raised, a stepped-up voltage may be supplied directly to the memory array 6, the address decoder 5 and so forth, in the case, it is not necessary to provide the need of the internal voltage generating circuit 3. However, if the internal voltage generating circuit 3 is not provided, although there is an advantage in which it is possible to simplify the construction of the circuit, the voltage control accuracy is deteriorated.

In the above described preferred embodiments, while the semiconductor integrated circuit device has had the memory cell array 6 having the EEPROM structure, the present invention may be applied to a semiconductor integrated circuit device in which a memory cell array 6 has a DRAM or SRAM structure other than the EEPROM structure. The present invention may be also applied to the voltage control of a semiconductor circuit other than the memory cell array 6. In this case, the state that the semiconductor circuit normally operates corresponds to the memory access state, and the state that the semiconductor circuit is waiting corresponds to the stand-by state.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor integrated circuit device comprising:
a semiconductor circuit driven by a voltage depending on a stepped-up voltage level raised from a first voltage level;
a first voltage detecting circuit for detecting fluctuation in the stepped-up voltage level during a first operation state of said semiconductor circuit; and
a second level detecting circuit for detecting fluctuation in the stepped-up voltage level during a second operation state of said semiconductor circuit, said second level detecting circuit being formed by a circuit having a power consumption lower than a power consumption of said first level detecting circuit,
wherein said first level detecting circuit and said second level detecting circuit are powered by a power supply voltage having the same voltage level.

2. The semiconductor integrated circuit device according to claim 1, wherein the stepped-up voltage level is set to a second voltage level based on a result detected by said first level detecting circuit during the first operation state, and is set to a third voltage level different from the second voltage level based on a result detected by said second level detecting circuit during the second operation state.

3. The semiconductor integrated circuit device according to claim 1, wherein the power consumption of said second level detecting circuit is less than or equal to a fourth of the power consumption of said first level detecting circuit.

4. The semiconductor integrated circuit device according to claim 1, further comprising an internal voltage generating circuit for generating an internal voltage in accordance with the stepped-up voltage level, the internal voltage being supplied to said semiconductor circuit.

5. The semiconductor integrated circuit device according to claim 2, wherein said internal voltage generating circuit is configured to set the internal voltage to a voltage level lower than the stepped-up voltage level during the first operation state of said semiconductor circuit, and further configured to set the internal voltage to a voltage level substantially equal to the stepped-up voltage level during the second operation state of said semiconductor circuit.

6. The semiconductor integrated circuit device according to claim 1, wherein the stepped-up voltage level is generated by a booster circuit, said booster circuit comprising a pulse generator for generating a pulse signal and a charging pump for raising the first voltage level to the stepped-up voltage level in accordance with the pulse signal, a level detecting operation of said second level detecting circuit being controlled by the pulse signal.

7. The semiconductor integrated circuit device according to claim 1, wherein said second level detecting circuit has a differential amplifier for comparing a voltage correlating to the stepped-up voltage level with a reference voltage of a predetermined voltage level in order to detect fluctuation in the stepped-up voltage level, a current consumption of said differential amplifier being controlled by a constant current source.

8. The semiconductor integrated circuit device according to claim 7, further comprising a reference voltage generating circuit for generating the reference voltage, a current consumption of said reference voltage generating circuit being controlled by said constant current source.

9. The semiconductor integrated circuit device according to claim 1, wherein at least a part of said semiconductor circuit is a memory cell array of an EEPROM structure, said memory cell array being driven on the basis of the stepped-up voltage level.

10. The semiconductor integrated circuit device according to claim 9, wherein the first operation state is a memory access state for allowing at least one of writing data to and reading data from said memory cell array, and the second operation state is a standby state for waiting for at least one of writing data to and reading data from said memory cell array.

11. The semiconductor integrated circuit device according to claim 1, wherein the stepped-up voltage level is generated by a booster circuit, said booster circuit comprising a first charging pump and a second charging pump having a driving force lower than a driving force of said first charging pump, said first charging pump being configured to set the stepped-up voltage level to a second voltage level during the first operation state of said semiconductor circuit, and said second charging pump being configured to set the stepped-up voltage level to a third voltage level different from the second voltage level during the second operation state of said semiconductor circuit.

12. The semiconductor integrated circuit device according to claim 1, wherein the first voltage level is a voltage level applied from a source located outside of said semiconductor integrated circuit device.

13. A semiconductor integrated circuit device comprising:
a semiconductor circuit driven by a voltage depending on a stepped-up voltage level raised from a first voltage level;
a first level detecting circuit for detecting fluctuation in the stepped-up voltage level during a first operation state of said semiconductor circuit;
a second level detecting circuit for detecting fluctuation in the stepped-up voltage level during a second operation state of said semiconductor circuit, said second level detecting circuit being formed by a circuit having a power consumption lower than a power consumption of said first level detecting circuit; and
a voltage control circuit for supplying a power supply voltage to said first level detecting circuit and stopping a supply of the power supply voltage to said second level detecting circuit during the first operation state, and stopping the supply of the power supply voltage to said first level detecting circuit and supplying the power supply voltage to said second level detecting circuit during the second operation state.

14. The semiconductor integrated circuit device according to claim 13, wherein the stepped-up voltage level is set to a second voltage level based on a result detected by said first level detecting circuit during the first operation state, and is set to a third voltage level different from the second voltage level based on a result detected by said second level detecting circuit during the second operation state.

15. The semiconductor integrated circuit device according to claim 13, wherein the power consumption of said second level detecting circuit is less than or equal to a fourth of the power consumption of said first level detecting circuit.

16. The semiconductor integrated circuit device according to claim 13, further comprising an internal voltage generating circuit for generating an internal voltage in accordance with the stepped-up voltage level, the internal voltage being supplied to said semiconductor circuit.

17. The semiconductor integrated circuit device according to claim 13, wherein said internal voltage generating circuit is configured to set the internal voltage to a voltage level lower than the stepped-up voltage level during the first operation state of said semiconductor circuit, and further configured to set the internal voltage to a voltage level substantially equal to the stepped-up voltage level during the second operation state of said semiconductor circuit.

18. The semiconductor integrated circuit device according to claim 13, further including a constant current source, said second level detecting circuit having a differential amplifier for comparing a voltage correlating to the stepped-up voltage level with a predetermined reference voltage in order to detect the fluctuation in the stepped-up voltage level, a current consumption of said differential amplifier being controlled by said constant current source.

19. The semiconductor integrated circuit device according to claim 13, wherein the first voltage level is a voltage applied from a source located outside of said semiconductor integrated circuit device.

* * * * *